(12) United States Patent
Rey

(10) Patent No.: US 11,978,571 B2
(45) Date of Patent: May 7, 2024

(54) METHOD OF COILING A SUPERCONDUCTING CABLE WITH CLOCKING FEATURE

(71) Applicant: Christopher M. Rey, Knoxville, TN (US)

(72) Inventor: Christopher M. Rey, Knoxville, TN (US)

( * ) Notice: Subject to any disclaimer, the term of this patent is extended or adjusted under 35 U.S.C. 154(b) by 758 days.

(21) Appl. No.: 16/948,241

(22) Filed: Sep. 9, 2020

(65) Prior Publication Data

US 2021/0012929 A1 Jan. 14, 2021

Related U.S. Application Data

(63) Continuation of application No. 14/545,599, filed on Apr. 30, 2014, now Pat. No. 11,133,120.

(60) Provisional application No. 61/818,994, filed on May 3, 2013.

(51) Int. Cl.
*H01B 12/06* (2006.01)
*H01B 12/00* (2006.01)
*H01F 41/04* (2006.01)
*H10N 60/01* (2023.01)
*H01B 7/36* (2006.01)

(52) U.S. Cl.
CPC ............ *H01B 12/06* (2013.01); *H01B 12/00* (2013.01); *H01F 41/048* (2013.01); *H10N 60/01* (2023.02); *H01B 7/36* (2013.01); *Y10T 29/49014* (2015.01); *Y10T 29/49071* (2015.01)

(58) Field of Classification Search
CPC .......... H01B 7/36; H01B 7/361; H01B 7/363; H01B 7/365; H01B 12/00; H01B 12/06; H01B 12/10; H10N 60/01; H10N 60/0128; H10N 60/0156; H10N 60/0268; H10N 60/0801; H10N 60/0856; H10N 60/20; H10N 60/202; H10N 60/203; H01F 6/06; H01F 41/048; H01F 41/06; H01F 41/061; H01F 41/063; H01F 41/064; H01F 41/066; H01F 41/068; H01F 41/074; H01F 41/07; H01F 41/077; Y10T 29/49014; Y10T 29/49071
See application file for complete search history.

(56) References Cited

U.S. PATENT DOCUMENTS

| | | | |
|---|---|---|---|
| 3,686,750 A | 8/1972 | Woolcock et al. | |
| 4,611,747 A | 9/1986 | Peppler et al. | |
| 5,042,904 A | 8/1991 | Story et al. | |
| 5,525,583 A * | 6/1996 | Aized | H01F 41/079 505/879 |
| 5,604,473 A * | 2/1997 | Rodenbush | H01F 6/06 505/879 |
| 5,668,912 A | 9/1997 | Keller | |

(Continued)

*Primary Examiner* — Peter Dungba Vo
*Assistant Examiner* — Joshua D Anderson
(74) *Attorney, Agent, or Firm* — TechnicalAttorney; Rick Barnes

(57) ABSTRACT

A method of coiling a superconducting cable, where the superconducting cable is comprised of a plurality of stacked superconducting tapes, where the superconducting cable has a clocking feature that identifies an orientation of the superconducting tapes, the method comprising the step of orienting coils of the superconducting cable, such that a magnetic field from surrounding coils impinge upon a given coil at a desired angle, based upon an orientation of the clocking feature.

20 Claims, 22 Drawing Sheets

(56) References Cited

U.S. PATENT DOCUMENTS

| | | |
|---|---|---|
| 5,767,441 A | 6/1998 | Brorein et al. |
| 6,293,081 B1 | 9/2001 | Grulick et al. |
| 6,437,248 B1 | 8/2002 | Giebel |
| 6,576,843 B1 | 6/2003 | Ashworth |
| 8,034,746 B2 | 10/2011 | Ha et al. |
| 2001/0043781 A1 | 11/2001 | Yokokawa et al. |
| 2003/0178653 A1* | 9/2003 | Reis .......................... H01F 6/06 |
| | | 257/236 |
| 2005/0028347 A1* | 2/2005 | Maher ................ H10N 60/0576 |
| | | 29/592.1 |
| 2005/0244115 A1 | 11/2005 | Bocanegra et al. |
| 2006/0104579 A1 | 5/2006 | Fitz |
| 2010/0099570 A1 | 4/2010 | Takayasu et al. |
| 2010/0190394 A1 | 7/2010 | Hine et al. |
| 2014/0034353 A1 | 2/2014 | Al-Ali et al. |
| 2014/0243207 A1 | 8/2014 | Takayasu |
| 2014/0302997 A1 | 10/2014 | Takayasu |

* cited by examiner

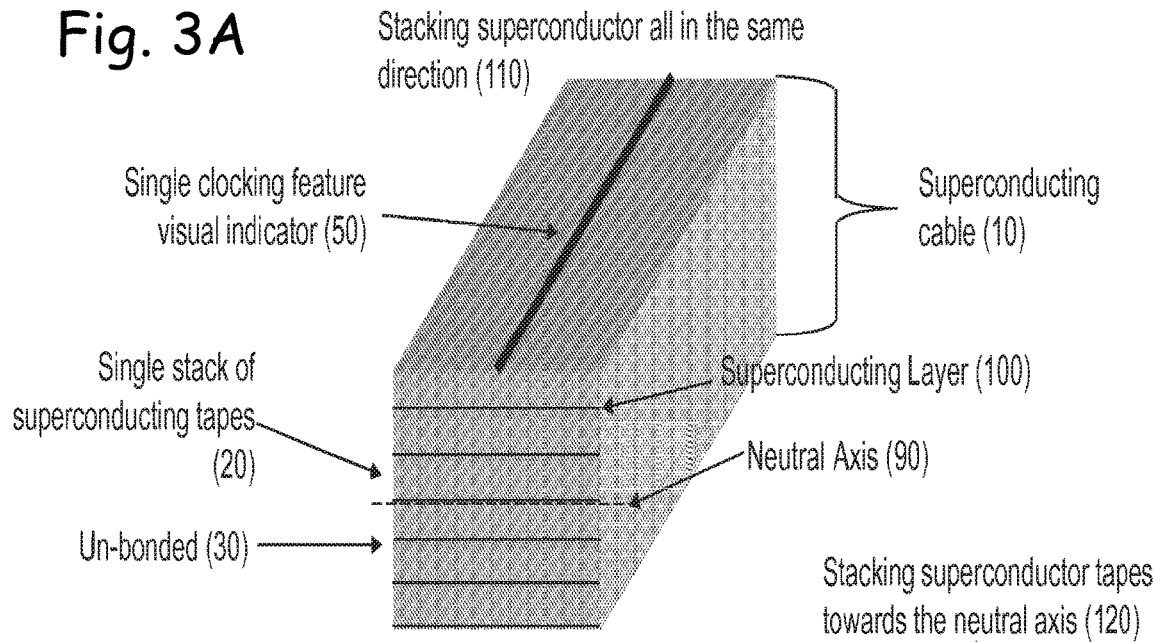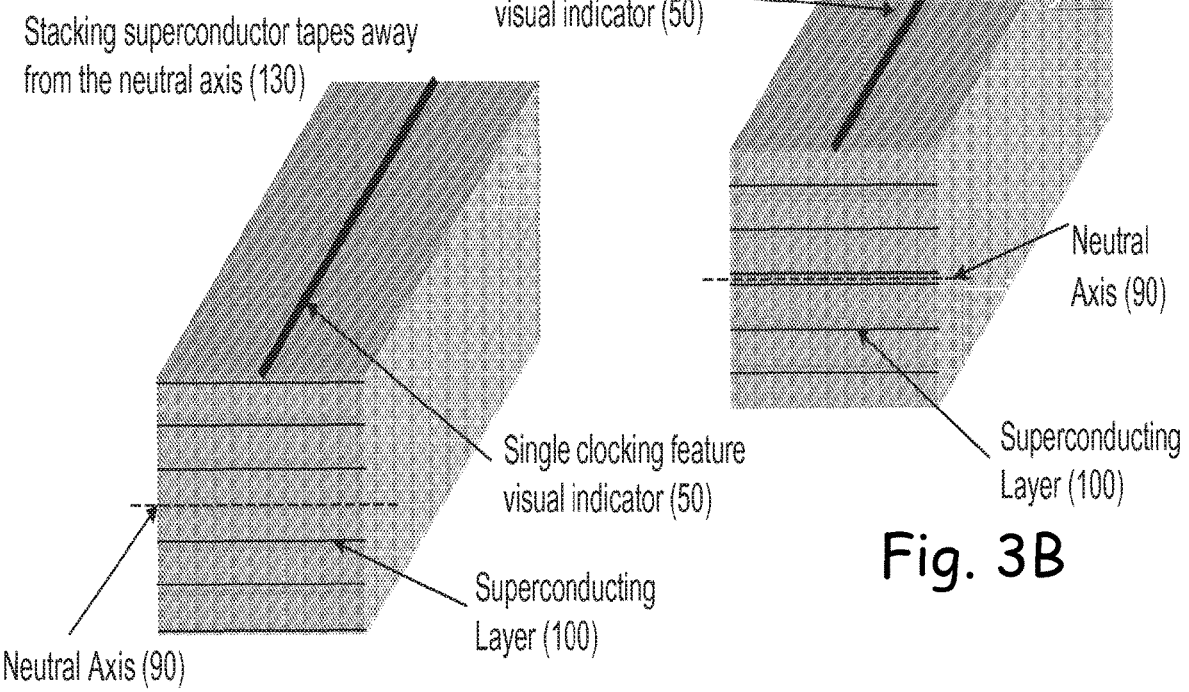

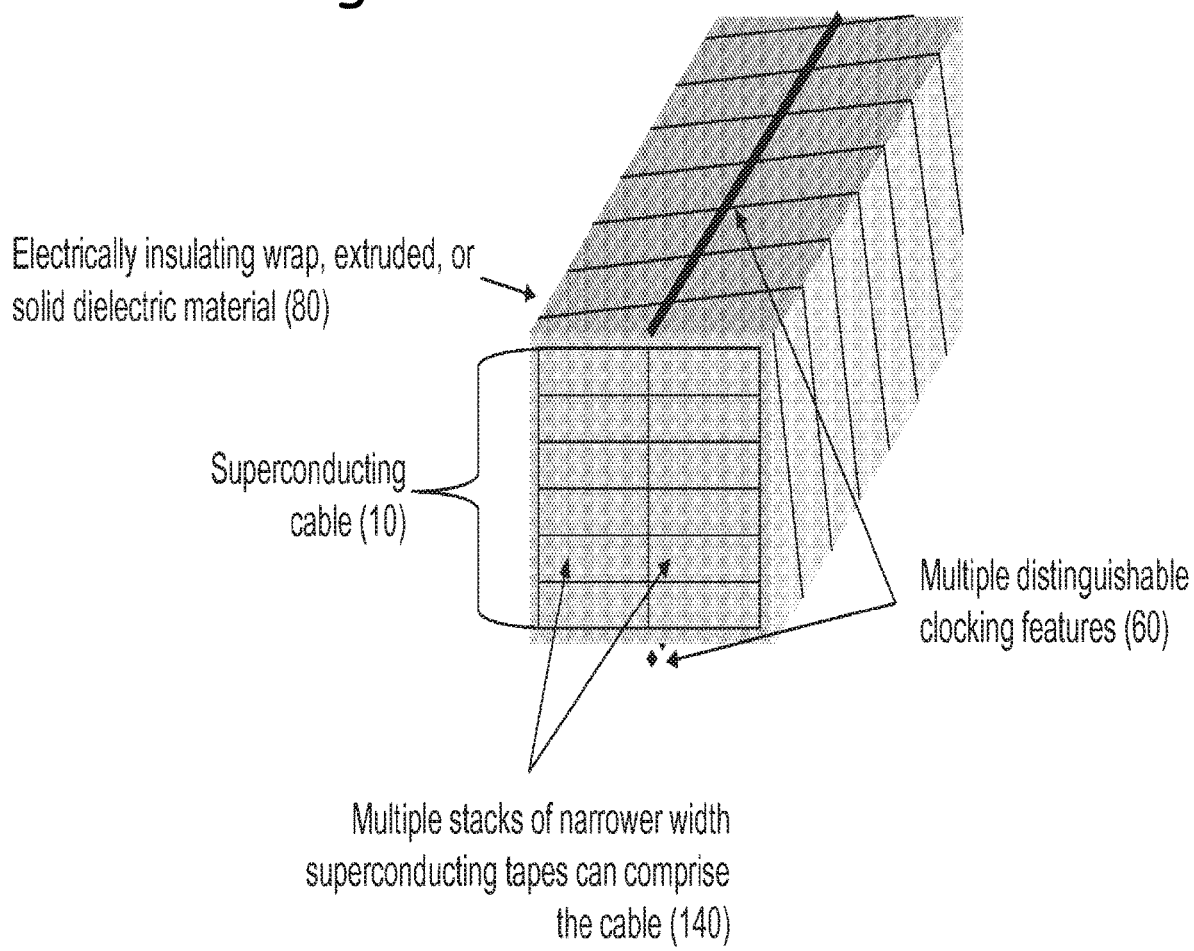

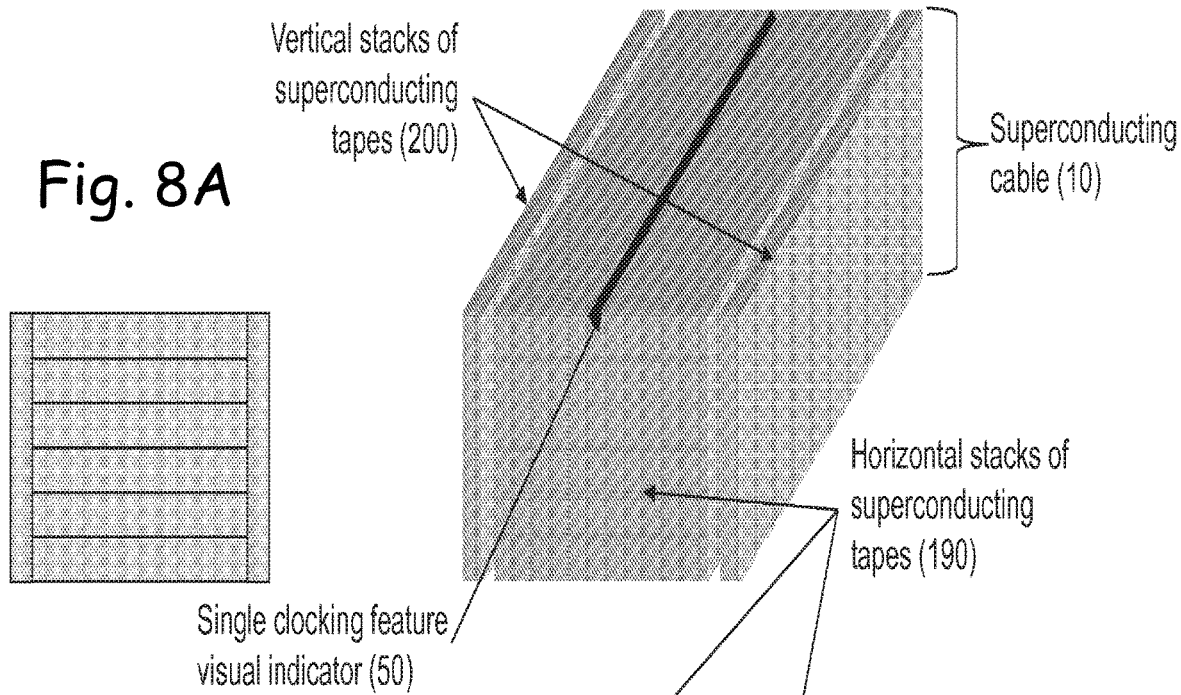
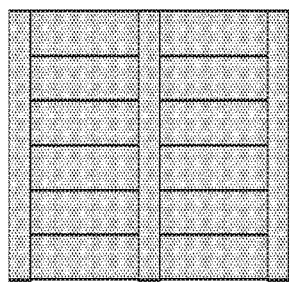
Fig. 8A
Fig. 8B

Fig. 12A

Single clocking feature mechanical mechanism (320)

Single stack of superconducting tapes (20)

Conduit or sheath (300)

Fig. 12B

Multiple stacks of superconducting tapes can comprise the cable (140)

Multiple distinguishable clocking features (330)

Superconducting CICC (310)

Fig. 12C

Conduit can be electrical insulated, wrapped, extruded, or solid dielectric material (80)

Single stack of superconducting tapes (20)

Superconducting cable (10)

Weld seam clocking features (333)

METHOD OF COILING A SUPERCONDUCTING CABLE WITH CLOCKING FEATURE

PRIORITY

This application is a continuation of and claims all rights and priority on prior pending U.S. non-provisional patent application Ser. No. 14/545,599 filed 2014 Apr. 30, and also claims priority on U.S. provisional patent application 61/818,994 filed 2013 May 3.

FIELD

This disclosure relates to high temperature superconducting (HTS) and low temperature superconducting (LTS) wires, tapes, superconducting cables, and superconducting cable-in-conduit-conductors (CICC). More particularly, this disclosure relates to a superconducting cable made from a plurality of superconducting conductors in the form or round or nearly round superconducting wires and/or flat superconducting tapes. This disclosure also includes enhancements from the inclusion of a single "clocking" feature or several clocking features that can identify the angular position (angular orientation) of the single stack or multiple stacks of superconducting conductors relative to the background magnetic field. Many useful and practical devices can be enabled by the superconducting wires, tapes, cables, and CICC described in this disclosure including: motors, generators, superconducting magnetic energy storage (SMES), fault-current-limiters (FCL), magnetic resonance imagers (MRI), nuclear magnetic resonance (NMR), fusion magnets, accelerator magnets, induction heaters, magnetic separators, and other superconducting devices.

BACKGROUND

Over the past several decades there has been a significant amount of R&D effort to develop practical, low cost HTS round wires, HTS flat tapes, and HTS cables for devices. Many of the efforts to make high current carrying capacity superconducting HTS wires, HTS tapes, and HTS cables at the lowest possible cost have met with some limited success. Most high temperature superconducting cable architectures; however, suffer from the same limitation caused by the anisotropic behavior of the HTS material. That is, when a component of the background magnetic field impinges at an angle, other than parallel relative to the longitudinal axis of the HTS conductor, the current carrying capacity rapidly decreases. For example, for a flat tape geometry, this happens when the external background magnetic field impinges perpendicular to the flat face of the tape. However, when the background magnetic field is parallel (or less than 6 to 8°) to the "plane face" of the HTS conductor, the current carrying capacity is significantly less degraded and remains quite high. Keeping the current carrying capacity high is beneficial since it reduces the amount of superconducting tapes which in turns lowers costs, weight, and shrinks the cross sectional area of the device being fabricated such as a SMES, FCL, MRI, NMR, motor, generator, etc.

SUMMARY

The above and other needs are met by a method of coiling a superconducting cable, where the superconducting cable is comprised of a plurality of stacked superconducting tapes, where the superconducting cable has a clocking feature that identifies an orientation of the superconducting tapes, the method comprising the step of orienting coils of the superconducting cable, such that a magnetic field from surrounding coils impinge upon a given coil at a desired angle, based upon an orientation of the clocking feature.

In various embodiments according to this aspect of the invention, the clocking feature includes a plurality of clocking features. In some embodiments, the clocking feature includes a plurality of color-coded clocking features. In some embodiments, the clocking feature is visually perceptible. In some embodiments, the clocking feature includes a stripe running along a length of the superconducting cable. In some embodiments, the clocking feature includes a groove running along a length of the superconducting cable.

In some embodiments, the superconducting tapes each have a substantially rectangular cross-section with a wider face and a narrower face. In some embodiments, the clocking feature is oriented such that the magnetic field impinges upon the wider face of the superconducting tapes of the successive coil. In some embodiments, at least a portion of the superconducting tapes are bonded together with a non-superconducting material.

In some embodiments, a successive coil is twisted as it is laid on a preceding coil, such that a magnetic field from the preceding coil impinges upon the successive coil at a desired angle, based upon an orientation of the clocking feature. In some embodiments, at least a portion of the superconducting tapes are separated one from another with at least one of and electrically conducting material, an electrically resistive material, and an electrically insulating material.

In some embodiments, the superconducting cable has at least one of a round cross-section, a hexagonal cross-section, and a rectangular cross-section. In some embodiments, all coils within a given layer of the coiled superconducting cable are laid with the clocking feature in a common orientation, and all coils within an adjacent layer of the coiled superconducting cable are laid with the clocking feature in an alternate orientation, where the alternate orientation is 180 degrees from the common orientation.

DRAWINGS

FIGS. 3A-3C show a single stack of single-sided multi-layer superconducting tapes and the orientation of the superconducting tapes relative to the neutral axis of the superconducting cable. Three different stacking orientation of the single-sided multi-layer superconducting tapes are shown.

FIG. 5 shows a "bird's-eye-view" of multiple stacks of superconducting tapes forming a superconducting cable covered with electrical insulation with multiple distinguishable clocking features.

FIGS. 8A-8B show a "birds-eye-view" of a single stack and multiple stacks having both horizontally stacked and vertically stacked superconducting tapes.

FIGS. 12A-12C show various cross sections of a superconducting CICC with clocking features.

DESCRIPTION

Terms Used Herein

Figure 1A:
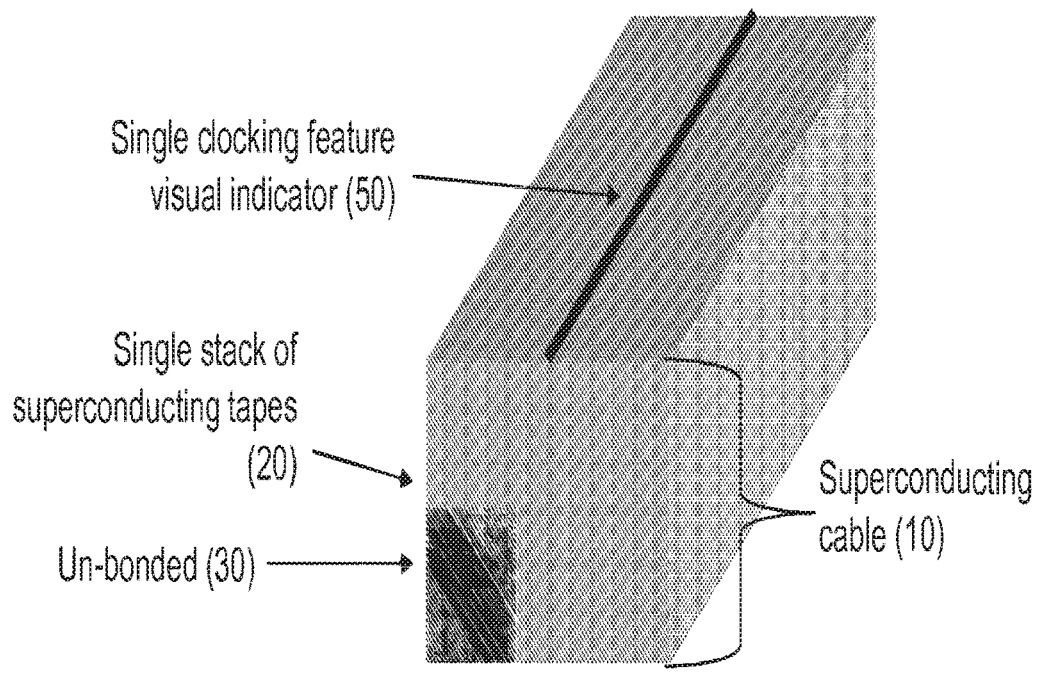
FIGS. 1A-1B show a "bird's-eye-view" of a single stack of multiple un-bonded superconducting tapes with a visual indicator for a clocking feature on a superconducting cable.

These explanations are provided for clarity and brevity purposes, and are not to be taken as binding for claim construction.

Cable: a single superconducting cable or multiple superconducting cables

CICC: Cable-in-Conduit-Conductor

Coil: a single coil or multiple coils

Conductor: a single round (or nearly round) superconducting wire or multiple round (or nearly round) superconducting wires or a single flat superconducting tape or multiple flat superconducting tapes, among other superconducting objects.

Current transfer/sharing: the terms current transfer or current sharing are used interchangeably throughout this disclosure to mean the current transfer among multiple superconducting tapes or wires.

FCL: Fault-current-limiter

HTS: High Temperature Superconducting

Ic: the critical current or the maximum amount of current that a superconductor can carry before transitioning from its superconducting state to its normal state at a specified temperature, magnitude of magnetic field, and direction of magnetic field.

LTS: Low Temperature Superconducting

MRI: Magnetic Resonance Imaging

Motor: a singular motor or multiple motors

Multi-layer superconducting tape: a ReBCO coated conductor tape or multiple tapes, a Bi-2223 powder-in-tube tape or multiple tapes, or a Bi-2212 round wire or multiple wires.

NMR: Nuclear Magnetic Resonance

Parallel Magnetic Field: Using a cylindrical coordinate system, the magnitude of magnetic field either in the circumferential direction $B\theta$ or axial direction $Bz$.

Perpendicular Magnetic Field: Using a cylindrical coordinate system, the magnitude of magnetic field in the radial or transverse direction $Br$.

Re: Rare-Earth

Rotate/Twist: The terms rotate and twist are used interchangeably to have the same meaning throughout this disclosure.

SMES: Superconducting-Magnetic-Energy-Storage

Stack: a single stack of multi-layer superconducting tapes or multiple stacks of multi-layer superconducting tapes or a single bundle of round superconducting wire or multiple bundles of round superconducting wires, among other superconducting objects of differing cross-section.

Tc: the temperature at which a material transitions from its superconducting state to its normal (non-superconducting) resistive state and depends upon the current flowing within and magnetic field within the material.

Overview

Superconductors are materials that when cooled below their superconducting transition temperature (Tc), have many wonderful and remarkable properties including: a) perfect diamagnetism, b) zero electrical resistance at direct current, and c) observable macroscopic quantum phenomena. This disclosure will primarily focus on exploiting a superconductor's property of zero electrical resistance, which in turn leads to very high currents that superconductors can carry, which in turns leads to potential devices with very high energy and power densities.

The maximum amount of current that a superconductor can carry before transitioning from its superconducting state to its electrically resistive normal state is known as the critical current (Ic), which will be referenced throughout this disclosure. The Ic in a superconductor will depend upon many extrinsic parameters such as the superconductor's operating temperature, the magnitude and direction of any magnetic fields, and the mechanical strain placed upon the superconductor.

A superconductor's Ic also depends upon many intrinsic parameters such as fabrication methods, chemical dopants and their concentration levels, artificial flux pinning centers, etc. Because the critical currents are so high in superconductors, many useful and practical devices can be realized by using superconductors, if both the extrinsic and intrinsic parameters can be properly controlled.

This disclosure will concentrate on the extrinsic parameters of temperature, magnetic field, and mechanical strain on a superconductor, but also discloses some important intrinsic parameters such as material composition and chemical doping. For clarity purposes in this disclosure, it is important to recognize that temperature is a scalar quantity while magnetic field is a vector quantity which depends upon both a magnitude and direction, and strain is a tensor quantity.

In general, superconducting materials exhibit either isotropic behavior or anisotropic behavior when subjected to magnetic fields and mechanical strains. Some superconducting materials have anisotropic behavior with respect to their crystallographic axis, where their properties are not the same in all three crystallographic directions.

There are many types of anisotropic behavior in both low temperature superconducting (LTS) and high temperature superconducting (HTS) materials, however this disclosure will be primarily concerned with just two types of anisotropic behavior in superconductors: 1) electromagnetic and 2) mechanical. Specifically, for the electromagnetic anisotropy in superconductors, this disclosure is focused on the difference in critical current (Ic) with respect to the orientation of the background magnetic field at a given operating temperature. That is, for anisotropic superconductors, the Ic will depend not only on the magnitude of the magnetic field but also upon the direction in which it impinges on the surface of a superconductor.

For example, HTS materials such as Re—Ba—Cu—O with its ortho-rhombic crystal structure has a lower critical current (Ic) when a magnetic field is oriented parallel to the c-axis of the crystal as compared to when a magnetic field is oriented relative to its a-b crystallographic axis. Likewise, for the mechanical anisotropy in superconductors, this disclosure is focused on the difference in critical current (Ic) when a flat superconducting tape is mechanically stressed edgewise compared to when it is stressed on the flat broad flat face of the superconducting tape.

Some superconducting materials, however, have isotropic behavior where their properties are the same in all three crystallographic directions when subjected to magnetic fields and mechanical strains. The Ic in an isotropic superconductor depends only upon its magnitude and not on the direction which it impinges on the surface of the superconductor. The LTS material NbTi for example exhibits highly isotropic behavior, where its Ic only depends upon the magnitude of the magnetic field and not the direction in which it impinges. There are also superconducting materials such as MgB2 that possess weakly anisotropic behavior.

This disclosure also describes the advantage in some superconducting materials of aligning superconducting crystals with their adjacent and adjoining neighbors. In some type of superconductors such as Re—Ba—Cu—O, Bi—Sr—Ca—Cu—O, etc., one advantage of aligning superconducting crystals is that they are able to carry useful amounts of current. However, randomly oriented superconducting crystals do not carry useful amounts of current.

A majority of the superconducting crystals in a superconductor can be mostly aligned with their adjacent superconducting crystals in the same superconductor. Often in commercially available superconductors, the mis-orientation angle of superconducting crystals at grain-grain boundaries must be less than 5-10 degrees. For grain boundaries with misalignments greater than these values, the current carrying capacity of the superconductor rapidly diminishes. Certain superconductors such as MgB2, NbTi, Nb3 Sn, Nb3Al, etc. do not show this improved current carrying capacity when the superconducting crystals are randomly aligned.

This disclosure describes an exemplary superconducting cable and superconducting cable-in-conduit-conductor that accounts for the anisotropic behavior in some superconductors by including an enhancement called a "clocking feature" that keeps track of the relative orientation of the superconducting cable relative to the background magnetic field of the superconducting device or its proximity to other external sources of magnetic field.

The maximum current carrying capacity (Ic) of the superconductor is thereby enhanced by orienting (via rotating/twisting) the superconductor to intercept the background magnetic field lines in the most favorable direction to the cable comprised of superconducting wire or tapes. There are other benefits of orienting the magnetic field impinging on the superconductor in the most favorable direction including: a) reduce hysteretic loss when subjected to time varying (AC) magnetic fields and AC currents and b) reduced magnetization fields caused by screening currents.

The former benefit is particularly advantageous in AC electric power applications such as transformers, motors, generators, SMES, FCL, etc., while the latter benefit is particularly advantageous in applications requiring high magnetic field homogeneity such as MRI and NMR. This disclosure also describes a calculation methodology with a subsequent winding and fabrication process to build an exemplary superconducting magnet or superconducting device enable by superconducting magnets such as SMES, FCL, MRI, NMR, motor, generator, transformers, etc.

In order to provide clarity in this disclosure, a cylindrical coordinate system $(r, \theta, z)$ is used to describe the magnetic orientation experienced by the superconducting conductor, superconducting cable, or superconducting CICC. In this cylindrical coordinate system, a "parallel" magnetic field is one where the magnetic field impinges parallel to the conductor in the either the circumferential direction $B\theta$ or the axial direction $Bz$. A "perpendicular" magnetic field is one where the magnetic field impinges perpendicular to the conductor in the radial direction $Br$. A "perpendicular" magnetic field is sometimes referred to as a radial or transverse magnetic field.

Thus, for a conductor with a flat tape geometry, parallel magnetic fields impinge either along the short axis of the tape (Bz) and the longitudinal axis of the tape ($B\theta$), while perpendicular magnetic fields impinge on the flat face of the tape (Br). The enhancements of higher Ic's in anisotropic superconductors described is this disclosure, is realized by optimizing the angular orientation of the superconductor so that external magnetic fields impinge parallel to the superconductor and not perpendicular. These enhancements in Ic are enabled through the clocking feature that is coupled to the superconductor.

In this disclosure the HTS conductors comprising the HTS cable are generally oriented parallel (or less than 6-8° inclination) relative to the background magnetic field and not continually twisted along the cable's longitudinal axis. In this disclosure, this parallel alignment of the multi-layer superconducting tapes with the background magnetic field is realized through the use of the clocking feature.

The continual twist of the HTS cable along its longitudinal axis is specifically avoided in this disclosure as it would negate the enhancement realized by orienting the multi-layer superconducting tapes parallel with the background magnetic field via the clocking feature (except for particularly unlikely magnetic fields). Therefore, in this disclosure, there are many locations within superconducting device that contain no twists of the superconducting cable along the longitudinal axis.

When anisotropic HTS conductors are oriented parallel to the external magnetic field, the HTS cable or HTS CICC will carry its maximum amount of current and have its minimal ac hysteretic loss, thereby reducing the amount of HTS conductor required to carry the same current. Using less HTS conductor reduces the costs, weight and cross sectional area of the superconducting device.

In this disclosure, the superconducting cable or superconducting CICC is rotated or twisted in two separate and distinct regions of the superconducting magnet or device: a) low magnetic field regions by 180 degrees to improve current transfer or current sharing among the superconducting conductors and b) in the high radial magnetic field (Br) regions to maximize Ic by aligning the crystallographic axis parallel (or nearly parallel) to the magnetic field.

A key feature in this disclosure is the inclusion of a clocking feature or multiple clocking features in the superconducting cable or superconducting CICC construction.

The superconducting cable in this disclosure orients the superconducting cable so that the magnetic field lines are parallel to the either the longitudinal axis of the conductor. The coupling losses in this disclosure are reduced by rotating the stack of superconducting tapes by 180° but only in the lower magnetic field regions of the device.

Stack of Multiple Superconducting Conductors

For brevity and clarity purposes in this disclosure, the term "stack" is often used interchangeably with the term "bundle" to refer to either flat superconducting tapes, round superconducting wires, or other superconducting objects of differing cross-section.

One embodiment is a superconducting cable having a plurality of flat tape-shaped ribbon superconductors stacked and assembled to form a rectangular cross section. The superconducting tapes can be from of one of the many known families of HTS materials such as the so-called "cuprates" which include: Re—B—Cu—O, Bi—Sr—Ca—Cu—O, Tl—Ba—Ca—Cu—O, Hg—Ba—Ca—Cu—O, where Re stands for Rare Earth.

It is also common to chemically dope these HTS materials with various types of chemical elements and compounds in the form of nano-particles, nano-dots, nano-rods, etc. to enhance the flux pinning force in these HTS materials, which translates to higher Ic in the presence of magnetic fields. Common chemical dopants in cuprate HTS materials include but are not limited to: Zr, ZrO, BaZrO3, Nb, etc. It is common to chemically dope the cuprates HTS materials with doping factions or concentration levels ranging from as low as 2-3% to s high as 15 to 20%.

These chemically doped Re—Ba—Cu—O superconductors have shown dramatic improvements of Ic in background magnetic fields over un-doped Re—Ba—Cu—O. Another family of HTS materials are the more recently discovered ferro-pnictides and ferro-chalcogenides, where pnictides are materials made up from the chemical group 15 of the periodic table such as Arsenic (As) and Phosphorous (P) and ferro-chalcogenides made up from group 16 of the periodic table such as Selenium (Se) or Tellurium (Te). Still another class of superconductors are low temperature superconductors such as NbTi, Nb—Sn, Nb—Al, Mg—B, and chemically doped alloys thereof.

In one embodiment, a multi-layer superconducting cable or CICC is comprised of a single stack of superconducting tapes of width (w). In another embodiment, a superconducting cable is comprised of multiple stacks of reduced width superconducting tapes (wi), where the sum of the multiple narrower widths (w1+w2+ . . . ) is equal to the total width (w). In this embodiment, the multiple stacks of superconducting tapes can be twisted and transpose about the longitudinal axis to help reduce AC losses.

Reducing the width of a flat multi-layer superconducting tape has many advantages including: a) greater flexibility when compared to wider multi-layer superconducting tapes, b) reduced hysteresis loss for perpendicular magnetic fields impinging on the flat face of the multi-layer superconducting tape, c) reduced magnetization screening currents which can cause perturbations in the magnetic field homogeneity, among other advantages. A disadvantage of reduced width multi-layer superconducting tapes is that they are typically more expensive per unit width that wider multi-layer superconducting tapes due to the additional processing steps required during fabrication.

In one embodiment, each multi-layer superconducting tape comprising the stack of multi-layer superconducting tapes is electrically isolated together from one another. In this embodiment, there are many ways to electrically isolate one tape from another such as: chemical coatings, spiral wrapping electrical insulation, co-extruding insulation, shrink wrapping insulation, etc. For example, in a superconducting cable used in degaussing applications for navy ships to reduce their magnetic signature, the multi-layer superconducting tapes comprising the superconducting cable are electrically isolated from one another, with each multi-layer superconducting tape forming a separate isolated current loop.

In another embodiment, each multi-layer superconducting tape is electrically connected or coupled to one another, so that current may transfer from one multi-layer superconducting tape to the other. Applications where the multi-layer superconducting tapes are electrically connected or coupled in parallel include: DC power transmission and distribution cables, bus bars, current leads, superconducting magnets, etc. In some applications alternating current (AC) applications such as power and distribution cables, motors, generators, transformers, etc., the multi-layer superconducting tapes are electrically connected or coupled in parallel, however, there is a some electrical resistance (R) between the superconducting tapes to help minimize the coupling between tapes which minimizes the AC loss. The magnitude of the electrical resistance between tapes is determined by several factors including the driving voltage, frequency of operation, bulk resistance of material, magnitude of acceptable AC loss, among other factors.

In one embodiment, the stack of multiple multi-layer superconducting tapes is electrically connected/coupled in parallel or electrically bonded using solder, co-extrusion, or pressure dependent electrical contact. In another embodiment, each individual superconducting tape is electrically isolated with insulating tape to form multiple independent parallel electrical paths. In another embodiment, an electrically resistive layer such as stainless steel, brass, CuO, aluminum, etc. is used to provide a known electrical contact resistance between the layers. This minimizes the losses in alternating field conditions.

The current carrying capacity of the stack of superconducting tapes can be either increased or decreased by adjusting both the number of superconducting tapes in the stack as well as the width of each superconducting tape within the stack. Likewise, if round wires comprised the superconducting cable, then the number of superconducting wires per bundle could be increased or decreased, the diameter of each wire could be increased or decreased, the number of superconducting filaments comprising the superconducting wire could be increased/decreased, etc.

Single or Multiple Stacks of Superconducting Tapes

In one embodiment, the superconducting cable or superconducting CICC has a single stack of multiple multi-layer superconducting tapes. The superconducting tapes can either be bonded or un-bonded, electronically connected or electrically isolated. In another embodiment, the superconducting cable or superconducting CICC can be comprised of multiple stacks of multi-layer superconducting tapes that are narrower in width than a single stack of wider multi-layer superconducting tapes. Any number of stacks made be used that best suits the application. Either the single stack of multi-layer superconducting tapes or multiple stacks of multi-layer superconducting tapes may contain splices that electrically connect two separate lengths into a longer single continuous length.

There are several advantages of having multiple stacks of narrower width multi-layer superconducting tapes versus a single stack multi-layer superconducting tapes of the equivalent width. With multiple stacks of narrower width multi-layer superconducting tapes, the overall superconducting cable is more mechanically flexible than the single stack of multi-layer superconducting tapes with an equivalent width.

This is particularly important in the embodiment where the superconducting cable or CICC may have to be bent in the so-called "hard" or "in-plane" direction. Narrow width multi-layer superconducting tapes have smaller/tighter bend diameters than a single wider superconducting tape of equivalent width. Another advantage of multiple narrower stacks of multi-layer superconducting tapes over a single stack of multi-layer superconducting tapes of equivalent width is superior torsional twisting properties that can lead to tighter/smaller cable twist pitches.

Yet another advantage of multiple narrow width stacks of multi-layer superconducting tapes over a single stack of multi-layer superconducting tapes of equivalent width is lower AC loss from time varying magnetic fields applied to the flat face of the superconducting tapes. Still another advantage of multiple narrow width stacks of multi-layer superconducting tapes over a single stack of multi-layer superconducting tapes is the reduction in magnetization currents.

This is particularly important in high magnetic field homogeneity magnets such as MRI and NMR. The current carrying capacity of the stack of multi-layer superconducting tapes can be either increased or decreased by adjusting both the number of tapes in the stack as well as the width of each superconducting tape within the stack.

Horizontal and Vertical Stacks of Superconducting Tapes

In one embodiment, the superconducting cable or superconducting CICC has a single stack of multiple multi-layer superconducting tapes or multiple stacks of narrower width multi-layer superconducting tapes with a rectangular, square, or some other cross section in which the stack of superconducting tapes is aligned vertically and contains at least one or more multi-layer superconducting tapes.

In one embodiment, the number of vertically stacked superconducting tapes relative to the number of horizontally stacked superconducting tapes combined with the optimal clocking position is precisely engineered to minimize the superconducting tape usage. The advantage of horizontal stacking and vertically stacking multi-layer superconducting tapes in a single stack is in applications where a non-homogenous magnetic field in impinging on the superconducting cable. Since the magnetic field is a vector quantity with both a magnitude and direction, the multi-layer superconducting tapes stacked in the most favorable direction (i.e. parallel to the longitudinal axis of the superconductor) can carry the majority of the current.

In one embodiment, the number vertically stack superconducting tapes is equal to the number of horizontally stacked superconducting tapes that comprise the superconducting cable or superconducting CICC. In this embodiment, the magnetic field produced by the current flow in the superconducting cable or superconducting CICC, i.e. the so-called "self-field" of the superconducting cable, is smaller in magnitude and falls off more quickly at distances from the cable than a superconducting cable that contains all of its superconducting tapes stacked in only one orientation.

Stacking of Superconducting Tapes Facing Inwards/Outwards to the Neutral Axis When fabricating a superconducting cable or superconducting CICC from a stack of multi-layer superconducting tapes in which only one side is coated with superconducting material, there is a choice in which direction the superconducting layer faces relative to the neutral axis of the stack of tapes. The neutral axis of the stack is the central axis of the stack in which tapes are stacked either above or below the axis. In one embodiment, all of the superconducting tapes are stacked so as to face inwards towards the neutral axis of the superconducting cable or superconducting CICC. The advantage of this arrangement of superconducting tapes is that it helps keep the mechanical strain on the superconductor "compressive" when the superconducting tapes are bent along the neutral axis of the superconducting stack. This embodiment is most relevant to single-sided superconductive coatings and less applicable to double sided superconductive coatings.

In another embodiment, all of the superconducting tapes are stacked so as to face outwards away from the neutral axis of the superconducting cable. This arrangement of superconducting tapes helps keep the strain on the conductor tensile when the superconducting tapes are bent along the neutral axis of the superconducting stack. This embodiment is most relevant to single-sided superconductive coatings and less applicable to double sided superconductive coatings.

In another embodiment, the superconducting tapes are stacked with one half of the tapes facing inwards (i.e. in compression) towards the neutral axis and the other half of the superconducting tapes are facing outwards (i.e. in tension) with respect to the neutral axis. This method of stacking is most relevant to single-sided superconductive coatings and less applicable to double sided superconductive coatings.

In another embodiment, the superconducting tapes are stacked with mixtures of superconducting tapes facing inwards towards as well as outwards away from the neutral axis of the stack.

Bonded or Un-Bonded Superconducting Tapes

In one embodiment, the superconducting tapes within a stack or the multiple stacks of superconducting tapes are fully or partially bonded together using electrically conducting material such as solder, co-extrusion, cold welding, pressed contract, conductive epoxies, or other electrical bonding methods. For the special case of ReBCO multi-layer superconducting tapes, they need not be symmetrically coated on both sides with superconducting material.

At the time of this writing, it is more common to coat/deposit a superconducting layer on only one side of the tape and not on both sides of the ReBCO multi-layer superconducting tape. The multi-layer superconducting tapes can be coated on both sides with superconducting material, although this is less common and not commercially available at the time of this writing.

The superconducting layers can be surrounded on one side with a thin low-resistivity layer, while on the other side by a thicker, high resistivity layer (the usually highly resistive substrate, presently made from a high resistivity nickel alloy such as Ni—W, Ni—Cr, or Ni—Mo—Cr alloy sold under the brand name hastelloy C-276. In the case of the electrically bonded single-sided multi-layer superconducting tapes, it is often useful to electrically connect via solder the multi-layer superconducting tapes such that each superconducting side tape is facing the other superconducting side.

Current transfer between these two multi-layer superconducting tapes with both superconducting sides facing each other occurs with reduced voltage and power dissipation due to the lower electrical contact resistance, typically in the range of 10-6 to 10-9 ohm-cm2 at 77K. When the superconducting side of one tape is not facing the superconducting side of another tape and the two multi-layer superconducting tapes are electrically connected or bonded, the resulting electrical connection has a much higher electrical contact resistance typically in the range of 10-3 to 10-5 ohm-cm2 at 77K.

In another embodiment, the superconducting tapes within the stack or multiple stacks are left completely unbounded, which reduces stress on the superconducting tapes when they are twisted and bent. Current can still electrically transfer between the multi-layer superconducting tapes via pressed contact but with higher electrical contact resistance, typically in the range of 10-4 to 10-6 ohm-cm2 at 77K.

In another embodiment, the superconducting tapes within the stack are either fully or partially bonded with electrically resistive material between the adjacent superconducting tapes. There are many ways to electrically connect or bond one superconducting tape to another using an electrically resistive material sandwiched in between with the simplest being a pressed contact. Common types of electrically resistive materials including: stainless steel, nickel alloys, brass, bronze, copper alloys, aluminum alloys, etc.

Yet in another embodiment, the superconducting tapes within the stack are either fully or partially bonded with electrically insulating materials such as epoxy, glues, coatings, etc.

Double Sided Coatings

Increasing the current carrying capacity of a superconductor is beneficial in many ways. It lowers the cost of the superconducting device by requiring fewer conductors for the same number of ampere-turns, reduces the weight/mass of the device, and shrinks the superconducting devices volumetric size and footprint.

In one embodiment, the current carrying capacity of the superconducting cable or superconducting CICC is further increased by the use of double sided coatings on the multi-layer superconducting tapes. For the second generation ReBCO coated conductors, as the technology improves thicker superconductor coatings further enhance the current carrying capacity.

Magnetic Materials

The use of highly permeable magnetic materials in a superconducting device could be advantageous and useful in many applications. For example, highly permeable magnetic materials could be used to help passively shield a superconducting device from unwanted fringe/stray fields such as the back-iron in a stator winding of a superconducting generator/motor coil or a passively shield MRI coil.

Highly permeable magnetic material could be used in in the core of an electromagnet such as a superconducting transformer to help enhance the magnetic field, which thereby reduces the required number of ampere-turns for the same magneto-motive force. Highly permeable magnetic materials could be used to help improve the magnetic field uniformity such as the iron yoke of a superconducting accelerator magnet.

Highly permeable magnetic materials could be used for magnetic "shimming" in an MRI/NMR coil. There are many types of magnetic permeable materials that could be beneficial in a superconducting device including: iron, iron alloys, nickel, nickel alloys, cobalt, cobalt alloys, steels, and combinations thereof.

For AC power applications such as motors, generators, transformers, etc. it is also useful to use thin iron laminate sheets typically 0.1 mm to 1 mm thickness, that are electrically coated with non-conductive materials. This helps to reduce both the hysteretic losses and eddy current losses of the magnetic permeable materials when subjected to time varying magnetic fields. Silicon doped steels are often used for laminated applications because of their increased electrical resistance and high magnetic permeability.

In one embodiment, the superconducting cable or superconducting CICC has non-superconducting magnetic permeable material in the form of thin laminate tapes between the multi-layer superconducting tapes. The advantage of having magnetic permeable material between multi-layer superconducting tapes is that the magnetic field form one superconducting tape is shielded from the other superconducting tape which will enhance its Ic. This form of magnetic shielding of tapes is particularly useful at low magnetic fields in DC applications. Having magnetic permeable materials in between superconducting tapes is deleterious in AC applications as it will give rise to unwanted hysteric losses and hence additional heating.

Shape of Stack of Multiple Superconducting Tapes

The cross section of the single stack of superconducting tapes or the multiple stacks of superconducting tapes can have many different shapes and geometries depending upon the application and/or superconducting cable or superconducting CICC fabrication method. In one embodiment, the single stack or multiple stacks of superconducting tapes has a cross section that is square shaped. In another embodiment, the single stack or multiple stacks of superconducting tapes has a cross section that is rectangular shaped. The advantages of the rectangular shaped stacked over the square shaped stack will be discussed in a separate section titled mechanical anisotropy.

In one embodiment, a "pseudo-round" shape can be approximated by adjusting the various widths of the superconducting tapes within the stack to approximate a round conductor. An advantage of a pseudo-round shaped stack is that it facilitates insertion of the stack or multiple multi-layer stacks within the conduit or sheath to form a superconducting CICC. Another advantage of the pseudo-round shaped superconducting stack is that during compaction of the conduit or sheath around the superconducting stack, stress concentrations are substantially reduced.

In another embodiment, a multi-side polygon (e.g. a hexagon, octagon, etc.) shape can be obtained by careful control and adjustment of the widths of superconducting tapes within a stack or multiple stacks.

In one embodiment, Cu or Al non-superconducting tapes are used to control the shape of the stack. Non-superconducting tapes such as Cu or Al can also be inserted as necessary to adjust the shape of the stack. For example, a common technique to improve the magnetic field homogeneity and shape the magnetic field in superconducting accelerator magnets such as dipoles, quadrupole, sextupoles, etc. is to include non-superconducting wedged shaped pieces of Cu within a stack of superconducting cable.

The Cu or Al wedged shaped pieces help provide a precise stable platform to shape the desired 2-dimensional magnetic field. The addition of these non-superconducting Cu or Al tapes also enhances the electrical and thermal stability of the superconducting cable and helps to protect the superconducting device in the event of a quench. The non-superconducting tapes or wedges can also be made from high strength non-magnetic steel such as stainless steel or Hastelloy C-276 in order to enhance the tensile strength of the stack.

Mechanical Anisotropy

As stated previously, although there are many types of anisotropic properties in anisotropic superconductors, the two of primary interest in this disclosure are electromagnetic and mechanical anisotropic behavior with respect to current carrying capacity. A superconductor with mechanically anisotropic behavior will perform differently depending upon the direction of applied strain. For example, in a flat tape geometry if a uniform compressive strain is applied to the plane broad face of a flat superconducting tape it will behave differently than if it is applied to the thin edge.

Specifically, the critical current (Ic) of the superconducting tape will be degraded less for uniform compressive strains applied to the flat broad face of the superconducting tape than compared uniform compressive strains applied edgewise. This anisotropic mechanical behavior is particularly significant for the fabrication of superconducting CICC.

That is when the single stack or multiple stacks of superconducting tapes is inserted (i.e. pulled, pushed, both pushed and pulled) into the non-superconducting conduit/sheath and subsequently compacted (i.e. uniform compressive strain), the superconducting tape's Ic will degrade more rapidly as the uniform compressive strain is applied to the thin edge of the single stack or multiple stacks of superconducting tapes.

To minimize the compressive strain edgewise relative to the broad flat face, there are several fabrication methods that can be employed to reduce the Ic degradation in the single stack or multiple stacks of superconducting tapes including: change the aspect ratio (height to width) of the stack, b) creating pockets/void spaces in the conduit/sheath at the outer most edges where the stress concentrations of the superconducting tapes are the highest, c) creating a weak point in the conduit/sheath and rotating the stack of superconducting tapes to the most favorable direction such that as the conduit/sheath is compacted, it engages (i.e. comes into physical contact with) the broad flat face prior to the edge of the superconducting tape, as well as other methods.

In one embodiment, a superconducting CICC is fabricated with a superconducting cable comprised of a single stack or multiple stacks of superconducting tapes. In this embodiment, the superconducting cable has a rectangular (not square) geometry where the stack of superconducting tapes is taller than it is wide. In this embodiment, the superconducting cable is inserted in the non-superconducting conduit/sheath and subsequently compacted by applying a uniform compressive stress to form a superconducting CICC.

The non-superconducting conduit/sheath will then engage the broad, flat, face of the stack of superconducting tapes prior to it engaging the thin edges of the superconducting tapes, because of the rectangular cross section (i.e. aspect ratio) of the superconducting cable. In this embodiment, the compressive strain is larger on the broad flat face of the stack than it is on the thin edge of the stack. The goal of this embodiment is to minimize the degradation in Ic caused by the CICC fabrication process and due to the mechanical anisotropic behavior of the superconductor.

In another embodiment, a superconducting CICC is fabricated with a superconducting cable comprised of a single stack or multiple stacks of superconducting tapes. The superconducting cable is inserted (pulled, pushed, or combination of both) into an empty non-superconducting conduit/sheath. The conduit/sheath is subsequently compacted around the superconducting cable. In this embodiment, pockets/voids are designed and strategically placed at the corner edges of the non-superconducting conduit/sheath.

After the superconducting cable has been inserted into the conduit/sheath, the conduit/sheath is uniformly compacted around the superconducting cable by applying a uniform compressive stress. The strategically placed pockets/voids at the corners of the conduit/sheath avoid engagement of the conduit/sheath in these corner locations as the conduit/sheath is compacted around the superconducting cable thus avoid stress/strain concentrations in the corners. The peak stress in the corners of the superconducting cable is thereby lowered. The goal of this embodiment is to minimize the degradation in Ic caused by the CICC fabrication process and due to the mechanical anisotropic behavior of the superconductor.

In another embodiment, a superconducting CICC is fabricated with a superconducting cable comprised of a single stack or multiple stacks of multi-layer superconducting tapes. The superconducting cable is inserted (pulled, pushed, or combination of both) into an empty non-superconducting conduit/sheath In this embodiment, a weak point is strategically designed into the non-superconducting conduit/sheath.

It is preferred that the weak point is also a mechanical clocking feature. The superconducting cable is rotated to a pre-determined angle and then inserted into the conduit/sheath. The conduit/sheath is subsequently compacted around the superconducting cable by applying a uniform compressive stress, but because of the strategically designed weak point in the conduit/sheath it preferentially compacts more easily/quickly along the weak point (e.g. mechanical clocking feature) than in the other directions.

In this embodiment, the superconducting cable was strategically rotated prior to insertion in the conduit/sheath such that the engagement of the conduit/sheath during compaction occurs first along the broad flat face of the superconducting cable prior to it engaging the thinner edge of the superconducting cable. In this embodiment, while the compressive stress is higher on the broad flat face the compressive strain is either less or comparable in both directions. The goal of this embodiment is to minimize the degradation in Ic caused by the CICC fabrication process and due to the mechanical anisotropic behavior of the superconductor.

Twisting of Multiple Superconducting Tapes

In this disclosure, there are two separate and distinct benefits of twisting/rotating the superconducting cable or superconducting CICC when forming a superconducting magnet or superconducting device: a) optimizing current carrying capacity (Ic) and b) improving current sharing/transfer among the plurality of superconducting conductors. The location and optimal twist/rotation angle are different for each.

The first benefit is due to the anisotropic behavior of many types of HTS superconductors. As discussed, the Ic of many type of anisotropic superconductors can be significantly enhanced by having the magnetic field impinge parallel (or nearly parallel) to the crystallographic axis of the superconductor. The amount of angular rotation for each conductor location is determined by an electromagnetic calculation that determines the optimal angle. For example, in a long solenoid magnet, this typically occurs at the farthest ends of the solenoid magnet, such that it is beneficial to rotate/twist the superconductor to it optimal angle to maximize Ic.

The second type of benefit that twisting/rotating the superconducting cable or superconducting CICC pertains to improving the current transfer or current sharing among a stack/bundle of superconducting conductors. As discussed previously, it can be beneficial to rotate the superconducting cable or superconducting CICC by 180° in the low magnetic field regions (<2-3 T) to improve current transfer/sharing among the superconducting conductors.

For example, if the superconducting cable is comprised of a stack(s) of superconducting tapes with a stack height of (h) and the superconducting cable is wound in a circular cross section of radius (R) to form a superconducting magnet, the superconducting tapes on the outermost edges will be at a slightly larger radius (R+h/2), while the superconducting tapes on the innermost edges will be at a slightly smaller radius (R−h/2). The result of having these slightly different radii is that the outermost superconducting tapes will have a larger self-inductance than he innermost tapes.

The different inductances among the stack of superconducting tapes can negatively impact the current transfer/sharing among the superconducting tapes when subjected to time varying currents and magnetic fields. A way to minimize this negative effect of higher inductance on the outer superconducting tapes than the inner superconducting tapes is to rotate or twist the superconducting cable or superconducting CICC by 180 degrees. However, if the superconducting cable or superconducting CICC is rotated by 180 degrees in the magnetic field, it will no longer be rotated to the optimal angle to carry the maximum amount of current.

At some point in the 180-degree rotation, the magnetic field will impinge perpendicular to the superconducting tape, which reduces the current carrying capacity. The preferred way to handle these two competing requirements is to rotate the superconducting cable or superconducting CICC by 180 degrees, to maximize current sharing/transfer among superconducting conductors, in the low magnetic field region but not in the high field regions. In the high radial or perpendicular magnetic field region (Br), the superconducting cable or superconducting CICC is rotated or twisted to the optimal angle that maximizes its current carrying capacity. For example, in a simple solenoid magnetic: a) the superconducting cable is typically not rotated in the central mid-plane region, b) rotated to its optimal angle to maximize its current carrying capacity at the farthest end regions, and c) rotated by approximately 180 degrees in the outer radial turns, to enhance current sharing or transfer among the superconducting conductors.

In one embodiment, the single stack or multiple stacks superconducting tapes comprising the superconducting cable or superconducting CICC are not continually twisted along the longitudinal axis and do not contain any twists within the winding pack.

In another embodiment, the single stack or multiple stacks superconducting tapes comprising the superconducting cable or superconducting CICC are twisted in regions of low magnetic field less than about 2-3 T, but not twisted in other regions where the magnitude of the magnetic field is greater than about 2-3 T. An example where the single stack or multiple stacks of superconducting tapes comprising the superconducting cable or superconducting CICC would have twists in some regions of low magnetic field but not in regions of high magnetic field is a simple solenoid coil.

To illustrate by example, a solenoid can be sub-divided into two separate and distinct regions: a) a central mid-plane region and b) a two end regions. In the central mid-plane region labeled region A in FIG. 5, no angular twist/rotation of the superconducting cable or superconducting CICC is typically required for the inner turns of the solenoid since the magnetic field is primarily parallel to the plane face of the superconducting tape and thus in a favorable orientation. At this location, the magnitude of the magnetic field is at its highest and its direction is primarily in the axial (i.e. Bz) and hence impinges mostly parallel to plane face of the stack of superconducting tapes. This is the most favorable orientation (i.e. maximum Ic), so no angular rotation of the superconducting cable is necessary.

In this section of the solenoid, the superconducting tapes comprising the superconducting cable are bent in the so-called "easy" direction. In the two end regions of the solenoid where the magnitude of the magnetic field is lower but the radial or transverse component of magnetic field (Br) is larger, however, the superconducting cable or superconducting CICC is rotated by a pre-calculated value so as to intercept the radial magnetic field lines from the solenoid in the most favorable direction of the superconducting cable or superconducting CICC. In this section of the solenoid, the superconducting tapes comprising the superconducting cable are bent in the so-called "hard" direction.

In this embodiment, the most favorable angular orientation of the superconducting cable or superconducting CICC, is one where the radial magnetic field lines from the solenoid impinge parallel (or mostly parallel) to the stack of multilayer superconducting tapes. In this embodiment, the superconducting cable or superconducting CICC is twisted up to 360 degrees, and only rarely more than 360 degrees. It is preferred that the twist pitch of the superconducting cable or superconducting CICC be within the range of strain tolerances so as not to degrade the current carrying capacity of the cable. This range is typically a single 360-degree rotation performed over a linear length of no less than 100-200 mm.

In one embodiment, the single stack or multiple stacks of superconducting tapes comprising the superconducting cable or superconducting CICC are twisted/rotated by approximately 180 degrees (not 360 degrees) at pre-determined locations of low background magnetic field. It is preferred that the ~180-degree rotational twist occur in regions of magnetic field less than 2-3T. For example, in a solenoid or toroid coil, the regions in the outer radius are much lower in magnitude magnetic field than in the inner radius region.

There are two primary advantages of periodically twisting of the single stack or multiple stacks of superconducting tapes by ~180 degrees at predetermined locations of low background magnetic field. First, it reduces the flux coupling losses the superconducting cable or superconducting CICC. Second, it helps to more evenly match the self-inductance of the superconducting tapes to one another. This will enhance equal sharing of current in under alternating current and alternating magnetic field conditions. The flux coupling creates undesired internal loop currents and magnetic flux jumps, which result in heat generation by resistive losses and magnetic hysteresis losses in the superconducting wires.

In the end regions of the superconducting solenoid, if the superconducting cable or the superconducting CICC is comprised of flat superconducting tapes and the cable or CICC is subsequently twisted, then during the coil winding process, the superconducting tapes will experience a bend in the so-called hard direction (i.e. plane face). In the central mid-plane region of the solenoid, the multi-layer superconducting tapes comprising the superconducting cable are bent about the thin axis and thus are bent in the easy direction.

Single Clocking Feature or Multiple Distinguishable Clocking Features

The inclusion of a single clocking feature or multiple clocking features on the superconducting cable or superconducting CICC is an important enhancement of this disclosure. A clocking feature is any feature that enables the identification of the angular orientation of the individual conductor or stack of multiple conductors relative to the background magnetic field.

Furthermore, a clocking feature need not be attached directly to the superconductor. A welded seam along the longitudinal axis of a non-superconducting conduit or sheath could be a clocking feature although it is not in direct contact with the superconducting conductor or superconducting cable. Voltage taps attached to the superconducting cable or superconducting CICC for example would not example of a clocking feature, since their attachment location and orientation relative to the background magnetic field have no angular correlation and hence are irrelevant.

The clocking feature allows the angular rotation or orientation of the superconducting cable or superconducting CICC to be adjusted (i.e. twisted) to its most favorable angular position relative to the background magnetic field experience by the superconducting cable. The background magnetic field experience by the superconducting cable or superconducting CICC can be generated by the superconducting device itself or by being in close proximity to another overlapping magnetic field emanating from another source, or a combination of both. A clocking feature can be any feature which uniquely identifies the angular orientation/position of a superconducting conductor, superconducting cable, or superconducting CICC to itself or by virtue of its location/proximity to another device generating a magnetic field.

In one embodiment, the superconducting cable or superconducting CICC has a single clocking feature. In another embodiment, the superconducting cable or superconducting CICC has two or more clocking features that help identify the orientation of the stack of conductors relative to the background magnetic field. In one embodiment, the single clocking feature or multiple clocking features is a visual marker or markers such as a colored ink line.

In another embodiment, the clocking feature or multiple clocking features is a mechanical indicator or mechanism such as a female groove or male protrusion on the conduit. If the clocking feature or features is mechanical in type such as a female groove or a male protrusion, it can also serve a dual purpose by providing a location for a tool for attaching to the superconducting cable or superconducting CICC and hence a means for twisting or rotating the superconducting cable or superconducting CICC to its optimal angular position during the fabrication of the superconducting device.

For example, a spanner type wrench may be located in the female grove or male protrusion of a conduit and subsequently used to twist/rotate the superconducting cable or CICC to its optimal angular position during the winding and fabrication process without damaging the superconducting cable or CICC. In addition, if the clocking feature is a female groove or channel and the groove is deep enough, then the clocking feature can also be used as a predetermined mechanical weak point in the cross section. Thus, when compacting the conduit/sheath around the superconducting cable, the conduit/sheath will preferentially collapse quicker along the weak point. This allows the design to take advantage of the mechanical anisotropy in the superconducting tape and have the conduct/sheath to apply a greater compressive stress to the flat face compared to the thin edge.

In another embodiment, the single clocking feature or multiple clocking features is a measurable quantity such as a magnetic marker. An example of a magnetic marker could be a seam weld along the longitudinal axis of a conduit or a magnetically tagged ink such as those used in currency identification. In another embodiment, the clocking feature(s) is an optical or visual feature that can be detected with the naked eye, a measurement instrument or both. A simple visual indicator could be an inked marked line along a stack of conductors or on the external conduit of a superconducting CICC.

In another embodiment, the superconducting conductor, superconducting cable, or superconducting CICC has multiple clocking features with its own unique identity, although identical features can also be used. There are many simple methods that could be used to uniquely identify each clocking feature. For example, the visual clocking feature could utilize multiple colors or shades of light and dark to uniquely identify each clocking feature. For example, the 0° angular position (12 o'clock) could have a black line, the 90° angular position (3 o'clock) could have a red line, the 180° angular position (6 o'clock) could have a green line, etc.

For mechanical clocking features, a unique identity for each feature could consist of grooves of slightly different shapes, sizes, or depths. For measurable quantities, this unique identify could be the strength of the measurable quantity itself. For example, if the measurable quantity were the magnetic moment produce by a longitudinal seam weld in a conduit, the size, shape, depth, and/or type of weld filler material could be adjusted to uniquely identify the magnetic moment of a given clocking feature and position. For example, the 0° angular position (12 o'clock) could have a relative magnetic moment of 1 unit, the 90° angular position (3 o'clock) could have a relative magnetic moment of two units, the 180° angular position (6 o'clock) could have a relative magnetic moment of 3 units, etc.

In another embodiment, the superconducting cable or superconducting CICC does not have an external clocking feature. Instead, a machine that first initially calculates the optimal angle to rotate or twist the conductor for each position/turn/location in the winding pack and subsequently both physically rotates and winds or bends the conductor to the correct radii. The advantage of this embodiment is that shifts the clocking features to one of quality control features versus a fabrication feature. The disadvantage of this embodiment is that the winding machine required calculate, rotate/twist, and wind/bend such a superconducting coil is very complicated and expensive.

Orienting the Cable or External Conduit

In one embodiment, the single stack or the multiple stacks of superconducting tapes are kept parallel (not twisted along its longitudinal axis) so that the magnetic field remains parallel to the face of the tape stack or stacks, for the central region of the solenoid or toroid. At the end regions of the solenoid or toroid, in this embodiment, the single stack or the multiple stacks of superconducting multilayer tapes are slightly rotated to the optimal angle that maximizes current carrying capacity and minimizes hysteretic ac loss.

The optimal angle is different for every application and must be calculated for each conductor turn/position. Once calculated, each conductor is then rotated to this optimal angular position during the winding fabrication of the magnet by first locating the clocking feature which identifies the angular position/orientation of the single stack or multiple stacks. The superconducting cable or superconducting CICC is then mechanically rotated/twisted using a tool so that the superconducting conductor is aligned to its most favorable direction (i.e. highest Ic) based upon the electromagnetic calculation.

The clocking feature of the superconducting cable or superconducting CICC is the feature that maps/guides/couples the physical orientation of the superconducting cable to the electromagnetic calculation.

Reducing AC Loss

Using a cylindrical coordinate system, rotating/orienting the multi-layer superconducting tapes so that the they intercept the magnetic field lines parallel (or nearly parallel) to the flat face of the superconducting tapes (i.e. in the Bz or Bθ direction) not only enhances the Ic of the superconductor it also reduces the AC loss and lowers the magnetization currents when exposed to transients or time varying magnetic fields. In particular, the hysteretic loss of a superconductor subjected to a time varying magnetic field is proportional to both the magnitude of the magnetic field and the size/dimension of the superconductor exposed to the magnetic field.

A common technique to reduce these unwanted losses is to reduce the size (i.e. physical dimension) of the superconductor. This is typically done through some type of subdivision of the superconductor, often referred to as filamentization. In a flat tape geometry the broad flat face of the tape typically has a larger physical dimension that the thin flat edge. Therefore, when a time varying magnetic field of a given magnitude (Br) impinges on the broad flat face of a superconducting tape, the hysteresis losses far are larger than when the magnetic field impinges to thin edge (Bz or Bθ).

Furthermore, for a ReBCO coated conductor tapes the actual thickness of the superconducting layer typically ranges between just 0.3 and 3 um, as compared to the superconductor tape width which typically varies between 1 mm and up 12 mm. Therefore, since the hysteric loss is directly proportional to the physical dimension of the superconductor, there is a significant reduction of these losses by rotating/orienting the multi-layer superconducting tapes so that they intercept the magnetic field lines parallel (or nearly parallel) to the flat face of the superconducting tapes. This is important for superconducting devices operating with AC currents and magnetic fields including: motors, generators, transformers, cables, fault-current-limiters, SMES, etc.

In one embodiment, the superconducting cable or superconducting CICC is rotated via the clocking feature or multiple clocking features so that it intercepts the magnetic field lines parallel (or nearly parallel) to the flat face of the superconducting tapes comprising the stack. This lowers the hysteretic loss of the superconducting tape when exposed to a time varying magnetic field and/or current.

Reduction of Magnetization Currents

Similar to the reduction in hysteretic AC losses mentioned above, the magnetization currents that a superconductor develops when exposed to a time varying magnetic field and/or current is directly proportional to the physical dimension of the superconductor. Magnetization currents are often deleterious in many applications requiring very precise, uniform magnetic fields. These magnetization currents generate unwanted spatial magnetic field perturbations that decay with time, thus degrading both the spatial homogeneity as well as the temporal stability.

Similar to hysteretic losses, a common way to minimize these unwanted magnetization currents are to reduce the size (physical dimension) of the superconductor typically through filamentization. Therefore, when a time varying magnetic field of a given magnitude (Br) impinges on the broad flat face of a superconducting tape, the magnetization currents are larger than when the magnetic field impinges to thin edge (Bz or Bθ). Furthermore, for a ReBCO coated conductor tapes the actual thickness of the superconducting layer typically ranges between just 0.3 and 3 um, as compared to the superconductor tape width which typically varies between 1 mm and up 12 mm.

Therefore, since the magnetization current is directly proportion to the physical dimension of the superconductor, there is a significant reduction of these currents (and hence error magnetic fields) by rotating/orienting the multi-layer superconducting tapes so that they intercept the magnetic field lines parallel (or nearly parallel) to the flat face of the superconducting tapes. This is important for superconducting devices with high magnetic field homogeneity and temporal stability including: MRI, NMR, accelerator magnets, etc.

In one embodiment, the superconducting cable or superconducting CICC is rotated via the clocking feature or multiple clocking features so that it intercepts the magnetic field lines parallel (or nearly parallel) to the flat face of the superconducting tapes comprising the stack. This lowers the magnetization currents of the superconducting tape when exposed to a time varying magnetic field and/or current.

Current Carrying Asymmetry in Clockwise and Counter-Clockwise Rotations

In some types of commercial HTS tapes, the current carrying capacity of the material is not only affected by the magnitude and angle of the magnetic field that impinges perpendicular face of the HTS tape, but also the rotational direction of the angle of the material. That is, there is an asymmetry in Ic between clockwise and counter-clockwise rotations with respect to the magnetic field vector. For example, it is not uncommon for some commercial ReBCO tapes to carry 50% less current at positive rotational angles when compared to the same angular value but rotated in the opposite direction. The reason for this asymmetry is due to the fact that some ReBCO crystals are not grown perfectly flat to the planar substrate. The clockwise/counter-clockwise asymmetry effect appears more prominent in ReBCO tapes grown with ion assisted beam deposition (IBAD) or an inclined substrate deposition (ISD), where the ReBCO crystals are purposely grown off-axis to the plane face of the substrate.

To overcome this asymmetry in clockwise/counter-clockwise rotations and exploit this to an advantage, one embodiment includes multiple distinguishable clocking features. A single clocking feature allows the identification and tracking of the angular position of the HTS tapes relative to the magnetic field, whereas multiple distinguishable clocking features allow the rotational direction (e.g. clockwise vs. counter-clockwise) also to be identified and tracked as well.

External Conduit Material and Shape

In one embodiment, the single stack or multiple stacks of superconducting tapes is inserted inside an external conduit or sheath and that is subsequently compacted to form a superconducting cable-in-conduit-conductor (CICC). In one embodiment, the external conduit or sheath is made of a good electrical conductor such as copper or aluminum. An advantage of having a conduit/sheath of high purity, high electrical conductivity materials is that it can provide a low electrical resistance by-pass in the event of quench and thus help protect the superconducting device.

The disadvantages of a high purity, high electrical conductivity conduit/sheath include that these materials tend to be soft, resulting in a conduit/sheath that provides very little mechanical support for the large electromagnetic forces. In addition, when the conduit/sheath is a good electrical conductor it can have a very loss when subjected to time varying magnetic fields and currents. This loss can be somewhat mitigated by introducing an eddy current break in the conduit/sheath. In another embodiment, the conduit or sheath is made of a high strength material such as: steel, stainless steel, titanium, titanium alloy, Ni—Cr—Mo sold under the trademark Inconel™, Ni—Cu sold under the trademark Monel™ Cu—Sn (bronze), Cu—Zn (brass), copper alloys, aluminum alloys, etc.

High strength conduit/sheath materials are preferred for high field or large diameter applications where there are large electromagnetic forces (i.e. Lorentz forces) when the superconducting device is energized. These high strength materials also tend to be poor electrical conductors and hence have reduced losses when subjected to time varying magnetic fields and currents. The conduit or sheath could also be made of a non-electrically conducting material such as Teflon, PTFE (Polytetrafluoroethylene), fiber re-enforced plastic (FRP), thermoset plastic e.g. ULTEM, and fiberglass-epoxy resin composite. If the conduit or sheath is both high strength and electrically insulating, then it can serve dual purposes of mechanically supporting the superconducting cable and having reduced losses when subjected to time varying magnetic fields and currents.

The cross-sectional shape of the external conduit or sheath can have many different shapes depending upon the application. In one embodiment, the conduit or sheath has a round cross section on the outer perimeter with a square or rectangular hole inside to accommodate the single stack or multiple stacks of superconducting tapes located within its center. In another embodiment, the conduit or sheath has a hexagonal shape on the outer perimeter with square or rectangular hole inside to accommodate the single stack or multiple stacks of superconducting tapes.

A hexagonal shape CICC allows for a stiffer structure and better packing fraction of the CICC within a coil winding pack. Furthermore, a hexagon shaped conduit reduces stress concentrations by allowing loads to press against flat surfaces versus lines contacts provided by round conduits. A key feature for the conduit of any shape is the clocking feature or multiple clocking features which keeps track of the angular position of the conduit relative to the background magnetic field. There are several other useful shapes such as rectangular, square, octagonal, etc.

Conduction Cooling or Bath Cooling

In one embodiment, the superconducting cable or superconducting CICC is externally cooled by thermal conduction. In another embodiment, the superconducting cable or superconducting CICC is externally cooled by immersion into a cryogenic fluid such as liquid helium, liquid nitrogen, liquid hydrogen, liquid air, liquid neon, liquid oxygen, mixtures thereof, or other cryogenic fluids.

In another embodiment, the superconducting cable or superconducting CICC is cooled by a solid cryogen such as solid nitrogen, hydrogen, air, neon, oxygen, mixtures thereof, or other solid cryogens.

Internal Cooling or Forced Flow Cooling

In this disclosure, the term cryogenic "fluid" can apply to many aspects of a materials phase diagram including single phase liquids, single phase gas, two-phase gas-liquid mixtures, single phase supercritical fluids, etc.

In one embodiment, the superconducting CICC is internally cooled with forced flowed supercritical fluid (i.e. the coolant) such as He, N2, Ne, Air, H2, etc. In this embodiment, cooling channels are spirally or straight grooved down the length of the conduit or sheath and the coolant is in direct contact with the single stack or multiple stacks of superconducting conductors. The number, size, shape of the flow channels as well as the twist pitch along the longitudinal axis of the conduit/sheath are determined by appropriate flow conditions to keep the superconducting CICC thermally and electrically stable.

In one embodiment, a cryogenic coolant flow channel is placed within the single stack or multiple stacks of superconducting conductors using a thin non-superconducting spacer. The spacer placed between superconducting conductors within a single stack or placed between multiple stacks of superconducting conductors can be electrically conducting such as copper or aluminum, electrically resistive such as aluminum alloy, brass, or stainless steel, or electrically insulating such as G-10, G-11, ULTEM, etc. The spacer allows the coolant direct contact and increased surface area for heat removal while simultaneously lowering the flow resistance within the channel.

In another embodiment, both a forward and return path of the cryogenic coolant are included in the conduit or sheath. This type of forward and return flow arrangement is sometimes referred to as counter-flow. In one embodiment, such as a co-axial or tri-axial arrangement the forward/inlet coolant flow is along the central axis and the return coolant path is along the outer perimeter of the superconducting cable.

In another embodiment, the inlet/forward path and the return coolant path are reversed, where the return path is located along the central axis of the superconducting cable or superconducting CICC and the inlet/forward coolant flow is on the outer perimeter of the superconducting cable. In either configuration, it may be desirable to insert some thermal insulation between the forward and return coolant paths to better thermally isolate the superconducting tapes from the warmer return coolant path. By including a return path of the cryogenic coolant within a single cryostat, this provides for a more compact cryostat design, reduces required space, and avoids the complexity of locating a separate return line for coolant flow.

Electrical Insulation

The electric power (P) transmitted by the superconducting cables or superconducting CICC is a function of both the current (I) flowing in the device and the applied voltage (V), where P=I*V. Therefore, to maximize the power density of the superconducting cable or superconducting CICC it is not only important to transmit very high currents but it is also important that the applied voltage be as high as possible. To have high voltages the electrical insulation used in the superconducting cable should have a high dielectric strength value and be able to survive the harsh cryogenic operating conditions.

In one embodiment, the conductors that comprise the superconducting cables, superconducting CICC, superconducting coils, etc. are covered with cryogenically compatible electrical insulation. The electrical insulation on the conductors prevents electrical shorting between adjacent conductors. There are many types of cryogenically compatible insulations including: poly(4,4'-oxydiphenylene-pyromellitimide) sold under the trademark Kapton, polytetrafluoroethylene (PTFE), sold under the trademark Teflon by DuPont, s-glass, e-glass, epoxy, flame-resistant meta-aramid sold under the trademark nomex by DuPont, polyvinyl form resin, and other insulating materials. There are also many ways in which the electrical insulation can be applied to these conductors including: spiral wrapping with overlap, butt-wrapping with no overlap, co-winding, covering with heat shrinkable tubing, extrusion, dip coating, spray coating, plasma flame spray coating, and other insulating methods. Combinations of these methods may also be used.

In one embodiment, electrical insulation is spirally wrapped on the external dimension of the superconducting cable or superconducting CICC. The insulating layer or multiple insulating layers in used to electrically isolate the cable from adjacent turns as well as ground potential.

In another embodiment, a solid or extruded type of electrical insulation is used to electrically isolate the superconducting cable or conduit. Solid type electrical insulations include: fiber reinforced plastics such as G-10 and G-11, thermo-sets such as Ultem, and extruded dielectrics such as cross link polyethylene (XPLE).

In one embodiment in which aluminum or aluminum alloy is used as the conduit material, the aluminum may be anodized to enhance electrical isolation and thermal heat transfer.

In another embodiment, semi-conducting paper such as carbon paper or carbon fiber is used in combination with electrically insulating materials. The use of semi-conducting materials sandwiched between electrical conducting material and electrically insulating material helps smooth the electric field. This electric field smoothing has proved beneficial in reducing partial discharge and increasing dielectric strength.

Strain Limitations

Some superconductors are particularly sensitive to mechanical strain ($\varepsilon$), such as Nb—Sn, Nb—Al, Mg—B, ReBCO, among other superconductors. For these types of strain sensitive superconductors, it is important to limit their mechanical strain during winding, cool down and warm-up, and electromagnetic excitation. The mechanical strain can be in the form of bending strain, torsional strain, tensile strain, and compressive strain. Often an external support structure such as a conduit/sheath can help limit the strain experienced by the superconductor particularly when the modulus of the conduit/sheath is very high. Although the strain sensitivity of superconducting materials vary among materials, a typical range is $-0.4\%$ (compressive)$<\varepsilon<0.4\%$ (tensile).

In one embodiment, the single stack or multiple stacks of superconducting tapes has a cross section that is substantially rectangular, square, round, or other cross-section shape. It is preferred that when the superconducting cable or CICC is rotated (i.e. torsionally twisted) to its optimal angular position during the winding process and that the twist angle be within the range of strain torsional tolerances of the superconductor material. This twist angle is typically less than 270° over a 200 mm length relative to its untwisted state.

A bending strain on a conductor places the outer most edge (outer radius) of the conductor in tension and the innermost edge (inner radius) in compression. In one embodiment, the superconducting conductor is bent within the range of its minimum bend radius. The minimum bend radius of the conductor will depend of the shape, cross-sectional dimension of the conductor, and the type of superconducting material, but should be limited to bending strains <0.2-0.4% tensile and compressive strains when possible. Some superconducting conductors such as NbTi can tolerate much higher bending strains up to 1% without experience any noticeable degradation in current carrying capacity.

For some superconducting conductors with flat geometries such as tapes, there exists a so-called "easy" bend direction and a so-call "hard" bend direction depending upon the aspect ratio of the tape. When either bending in the "easy" direction or the "hard" direction of the tape (or stack of multiple tapes), the minimum bend diameter should typically keep the tensile and compressive strains to <0.2-0.4% when possible in order to avoid degradation of the current carrying capacity.

Electrical Splicing

In one embodiment, the single stack or multiple stacks of superconducting tapes contains no electrical splice joints. In another embodiment, the single stack or multiple stacks of superconducting tapes are electrically connected via a splice joint to form a longer single length. This electrical connection can be made by using one or more of the following splice joint configurations including: butt joints, lap joints, bridge joints, interleaved joints, and praying hands joints, etc. There are many electrical jointing techniques including: solder, cold welds, pressed contacts, hot welds, etc. or a combination of these joining techniques. It is preferred that the electrical splices are made in the lower magnetic field regions (<1-2 T) of the superconducting device, since a splice joint represents an interruption in the flow of supercurrents and thus presents a weak point. It is preferred that this weak point occurs in a region of lower magnetic field so as not to further degrade the Ic of the superconducting cable.

In one embodiment, a splice joint is made by interleaving the superconducting conductors within a single stack. By interleaving the superconducting conductors within a single stack this transposes the position of the superconducting tape within the stack. This transposition reduces magnetic flux coupling losses.

In another embodiment, the superconducting stacks themselves may be interleaved. It is often preferred that these interleaved splice joints are made in a region of low magnetic field (<1-2 T) such as the outer radius of the coil. Since an electrical splice joint interrupts the flow of the superconducting currents by introducing a normal resistive current path which will generate localized heating, it preferred to perform this operation in the low magnetic field region of the superconducting device, where the temperature margin of the superconductor is the highest.

Normal Metal Stabilizer Material

The inclusion of non-superconducting normal metal stabilizer material such as Cu or Al coupled to the superconductor is often necessary in the practical implementation of many superconducting devices. The normal metal stabilizer provides many useful functions in a superconducting device. For example, the normal metal stabilizer provides a convenient method for low electrical resistance connection, since many superconductors are difficult to solder or weld to directly.

The normal metal stabilizer will lower the voltage stress in the superconducting device in the event of a quench (i.e. transition from its superconducting state to its normal state) since the normal metal stabilizer provides a low electrical resistance path as compared to the higher electrical resistance of the superconductor when in its normal state. The normal metal stabilizer aids in the conduction of heat since most superconductors are poor thermal conductors. The metal stabilizer helps cool and heat the superconducting device more rapidly, as well as stabilize the superconductor itself form quenching in the event of localized heat generation caused by ac loss, frictional heat from conductor, movement, etc. Finally, normal metal coupled to the superconductor helps stabilize and recover from flux jumps and quenching by providing a low electrical resistance by-pass in the event of localized heating.

In one embodiment, the superconducting conductor includes a non-superconducting normal metal stabilizer coupled to the superconductor. Typical stabilizer materials include: Cu, Cu alloys, Al, Al alloys, Ag, Ag alloys, Au, brass, bronze, stainless steel, Va, Nb, and other normal metal materials. The amount of normal metal stabilizer in the cross-sectional area of a superconducting conductor varies for every application and needs to be optimized for the particular application and its operating environment.

There several ways to include normal metal stabilizer on the superconducting cable or superconducting cable-in-conduct-conductor including: a) conduit sheath, b) adding normal metal tapes within the stack of superconducting conductors, c) additional normal metal electroplated onto the individual superconducting conductor, d) normal metal soldered directly to the individual superconducting conductor form a laminated superconducting tape, e) extrusion of the normal metal surrounding the superconductor, and other coupling methods.

Method of Fabrication

This disclosure describes a multi-step fabrication method for a superconducting device or superconducting coil, comprised of a superconducting cable or superconducting CICC. In one embodiment, the fabrication method starts with performing detailed electro-magnetic calculations for a particular superconducting device, application, or coil geometry in order to determine both magnitude and direction of the magnetic field that the superconducting cable will experience at every location, turn, or position within the superconducting device or coil. The number of superconducting conductors relative to the amount of normal metal stabilizer conductors in the stacked superconducting cable can be adjusted depending upon the magnitude and direction of the magnetic field and its location within the winding pack.

For example, locations of the superconducting cable within the winding pack that will experience lower magnetic fields can have fewer superconducting conductors, while locations that experience higher (more intense) magnetic fields can have more superconducting conductors. Since the cost of superconducting conductors is far greater than normal metal stabilizer conductors, it is preferred to minimize the amount of superconducting conductors comprising the superconducting cable. One way that the amount of superconducting tapes relative to the amount of normal metal stabilizer tapes in the superconducting cable could be determined is by the fraction of critical current Ic the superconducting cable is designed to operate.

Preferred operating fractions of critical current typically range from 0.6 to 0.9 in HTS cables, while typical operating fractions of critical current range from 0.4 to 0.7 for LTS cables. Another important feature of the calculation is to determine the optimal angular orientation of the superconducting cable that maximizes its Ic for each turn within the winding pack. As stated previously, the optimal angular orientation is one in which the magnetic field impinges parallel (or mostly parallel) to the plane face of the superconducting tapes.

Once the relative number of superconducting tapes relative to the normal metal stabilizer tapes has been determined from this calculation and the optimal angular orientation of each conductor location within the device, the number of superconducting tapes and normal metal stabilizer tapes are then spooled up and subsequently stacked to form a superconducting cable comprising multiple superconducting tapes.

A single clocking feature or multiple clocking features is added to the superconducting cable so that its angular orientation relative to the (calculated) background magnetic field can be identified for placement within the winding pack. The superconducting coil/device is then wound with the superconducting cable with each turn (i.e. position in the winding pack) having a predetermined angular orientation/rotation that optimizes its current carrying capacity.

As the superconducting coil is wound, the superconducting cable is rotated to its optimal angular orientation by a twisting it with a tool. Each turn in the superconducting coil has its own optimal angular orientation, with the turns at the end of the solenoid requiring the most angular rotation and the turns at the central mid-plane requiring the least. The superconducting cable in the outermost radial turns (i.e. the regions of lower magnetic field) would be rotated/twisted by approximately 180° so as to improve the current transfer/sharing among the multiple superconducting conductors.

During the winding fabrication process, the angle of rotation required for a given turn of the superconducting coil is identified by the clocking feature on the superconducting cable relative to a fixed reference. The superconducting cable can then be twisted to that optimal angle for every turn in the superconducting coil. An advantage of this embodiment is that a simple winding machine that is not capable of performing the electromagnetic calculations and subsequently winding and twisting/rotating the conductor can be implemented.

In another embodiment, it is also possible to have the computer that calculates the optimal clocking angle based upon the electromagnetic calculation connected to the winding tool/machine that fabricates the superconducting device. This combined machine calculates and then subsequently winds and changes the clocking feature from direct fabrication to more of a quality control feature. The disadvantage of this approach is that this type of computer controlled winding machine capable of calculating the optimal rotation angle for maximum Ic is far more expensive than one without this capability.

In another embodiment, the superconducting device or superconducting coil is comprised of a superconducting CICC. The method of fabrication of a superconducting coil or superconducting device with superconducting CICC is similar to that above for the superconducting cable.

First, a detailed calculation electro-magnetic calculation is performed to determine both the magnitude and direction that the superconducting CICC will experience at each turn/position in the winding pack. Based upon this electromagnetic calculation, the number of superconducting conductors relative to the number of normal metal stabilizer conductors is adjusted to match the desired fraction of critical current of the superconducting CICC for each turn/position within the winding pack. The superconducting conductors and the normal metal stabilizer conductors are spooled and stacked to form a superconducting cable comprised of multiple superconducting conductors.

The superconducting cable is then inserted into a non-superconducting conduit or sheath. Typical insertion methods include pulling the superconducting cable through the conduit, pushing it through the conduit, or a combination of both pushing and pulling. The conduit will have either a single or multiple clocking features that identify the angular position of the superconducting cable relative to the external surface of the conduit.

The conduit is then compacted around the superconducting cable. There are many methods to compact the conduit around the superconducting cable. The preferred method is to pull it through a tube mill compacter. The final output of these steps is the superconducting CICC. The superconducting device or superconducting coil is then wound with the superconducting CICC. For each turn/position within the winding pack, there is a designated clocking position/orientation that was pre-determined by the electro-magnetic calculation.

The superconducting CICC is rotated to that designated clocking position by twisting the superconducting CICC with a tool. The superconducting CICC in the outermost radial turns (i.e. the regions of lower magnetic field) would be rotated/twisted by approximately 180° so as to improve the current transfer/sharing among the multiple superconducting conductors.

In another embodiment, the computer that performs the electromagnetic calculation to determine the optimal rotational angle for each conductor in the winding in order to maximize Ic, can also be coupled to the winding machine that subsequently winds the superconducting coil or device. This combined machine changes the clocking feature from a fabrication feature to a quality control feature. The disadvantage of this approach is that this type of computer controlled winding machine capable of calculating the optimal rotation angle for maximum Ic is far more expensive than one without this capability.

Various modifications to the superconducting cable and the methods described herein should become transparent from the above description of the various embodiments. Although the superconducting cable and superconducting CICC has been described in detailed from the embodiments, it should be understood that this explanation is for clarity and illustration and the invention is not limited to these embodiments. Various types of superconducting devices and operation techniques will thus be apparent to those skilled in the art in view of this disclosure. Modifications are thus contemplated and may be made without departing from the spirit of the invention, which is defined by the claims.

Figure 1B:
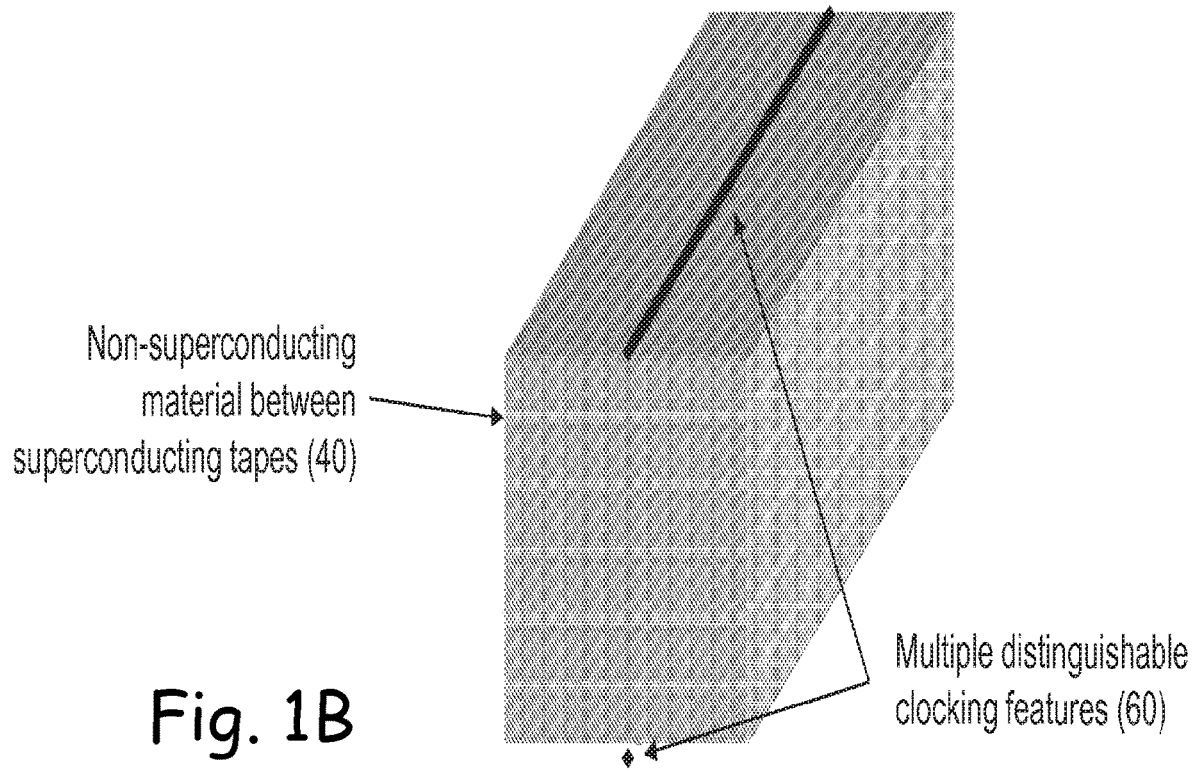

With reference to FIGS. 1A and 1B, a superconducting cable (10) may be comprised of a single stack of superconducting wire or tapes (20) comprised from Re—B—Cu—O, Bi—Sr—Ca—Cu—O, Tl—Ba—Ca—Cu—O, Hg—Ba—Ca—Cu—O, Mg—B, Nb—Sn, Nb—Ti, Nb—Al, or other superconducting materials. Suitable high temperature superconducting tapes are available from American Superconductor Corporation of Devens, Mass. and from SuperPower, Inc. of Schenectady, N.Y. as well as from other companies. Suitable low temperature superconducting wire or tapes are available from Oxford Superconducting Technologies in Carteret, N.J. or Luvata Inc. in Waterbury, CT, as well as from other companies. After the superconducting wires or tapes are stacked/bundled (10), they can be left un-bonded (30) to minimize stresses in the superconducting wires or tapes. With respect to FIG. 1B, the superconducting wires or tapes comprising the superconducting cable (10) can be also include non-superconducting material (40) sandwiched between the superconducting wires or tapes (10). The non-superconducting material can be: a) good electrical conductors such as Cu, Al, Ag, Au, b) poor electrical conductors such as Cu alloys, Al alloys, brass, bronze, stainless steel, iron, or c) electrical insulators such as those currently sold under the brands Kapton™, Cryoflex™. The superconducting cable (10) can have a single clocking feature that is a visual indicator (50) or multiple clocking features (60) added as described herein.

Figure 2A:
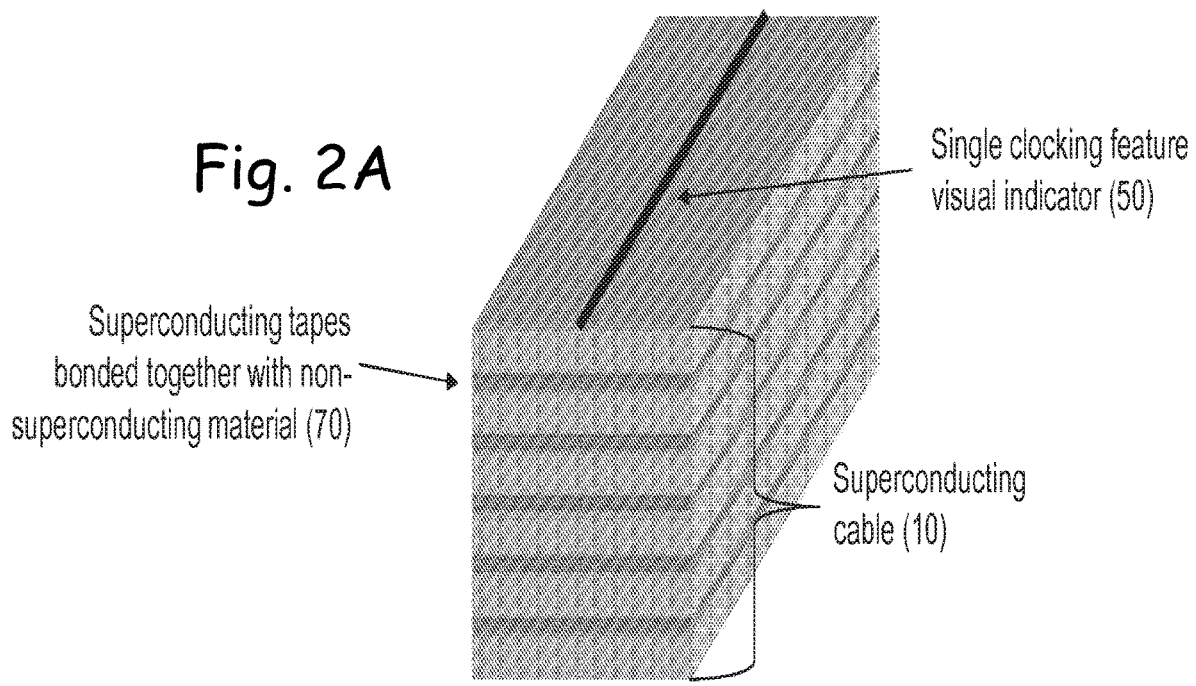
FIGS. 2A-2B show a "bird's-eye-view" of a single stack of bonded superconducting tapes intermingled with non-superconducting normal metal tapes, forming the superconducting cable. The superconducting cable is covered with electrical insulation and has a visual indicator for a clocking feature.
Figure 2B:
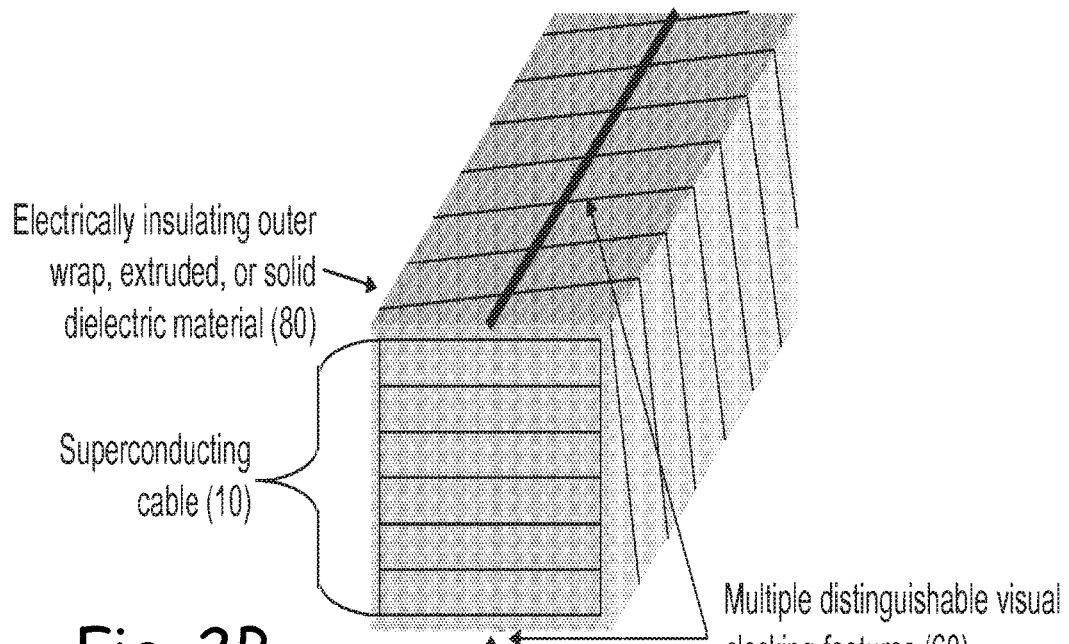

With reference to FIG. 2A, the superconducting wires or tapes (20) comprising the superconducting cable (10) can be electrically bonded together with non-superconducting material such as solder, co-extrusion with Al, conducting epoxy, etc. (70). With respect to FIG. 2B, the superconducting cable (10) can be wrapped or co-extruded with electrically insulating materials (80) such as those currently sold under the brands Nomex™, Kapton™ (polyimide), PTFE, Cryoflex™, etc. A clocking feature (50) or multiple clocking features (60) can be included for enhancements.

With reference to FIG. 3A, the superconducting cable (10) can be comprised of multiple superconducting tapes (20). The central axis of the stack of superconducting tapes (20) is known as the neutral axis (90). If the superconducting tapes are multi-layer superconducting tapes that are only coated on one side (100), then all of the multi-layer superconducting tapes (100) can all face in the same direction (110). With respect to FIG. 3B, all of the single-sided multi-layer superconducting tapes (100) can face inwards towards the neutral axis (120). With respect to FIG. 3C, all of the single-sided multi-layer superconducting tapes (100) can face outwards away the neutral axis (130). The single-sided multi-layer superconducting tapes (100) can also be co-mingled having facing both inwards and outwards away from the neutral axis (not shown).

Figure 4A:
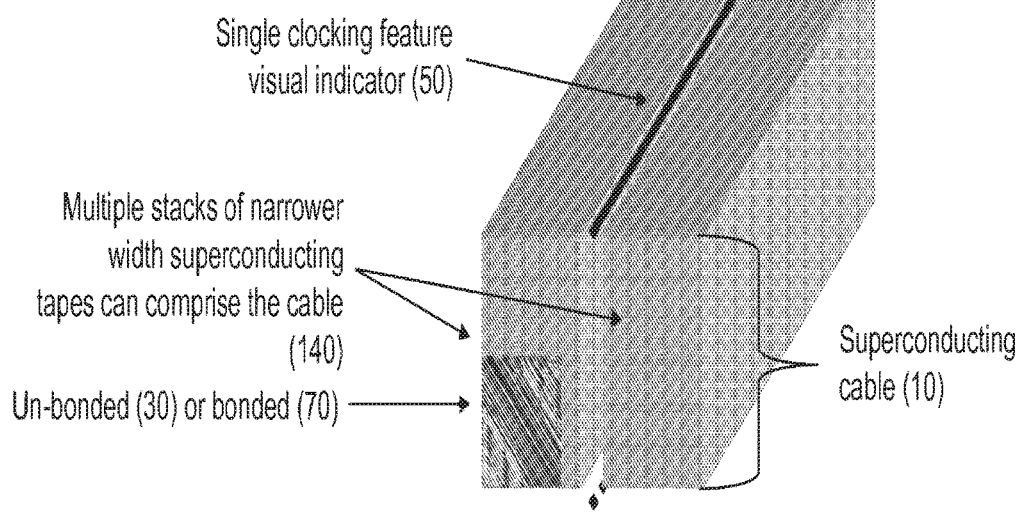
FIGS. 4A-4B show a "bird's-eye-view" of multiple stacks of superconducting tapes forming a superconducting cable with multiple distinguishable clocking features.
Figure 4B:
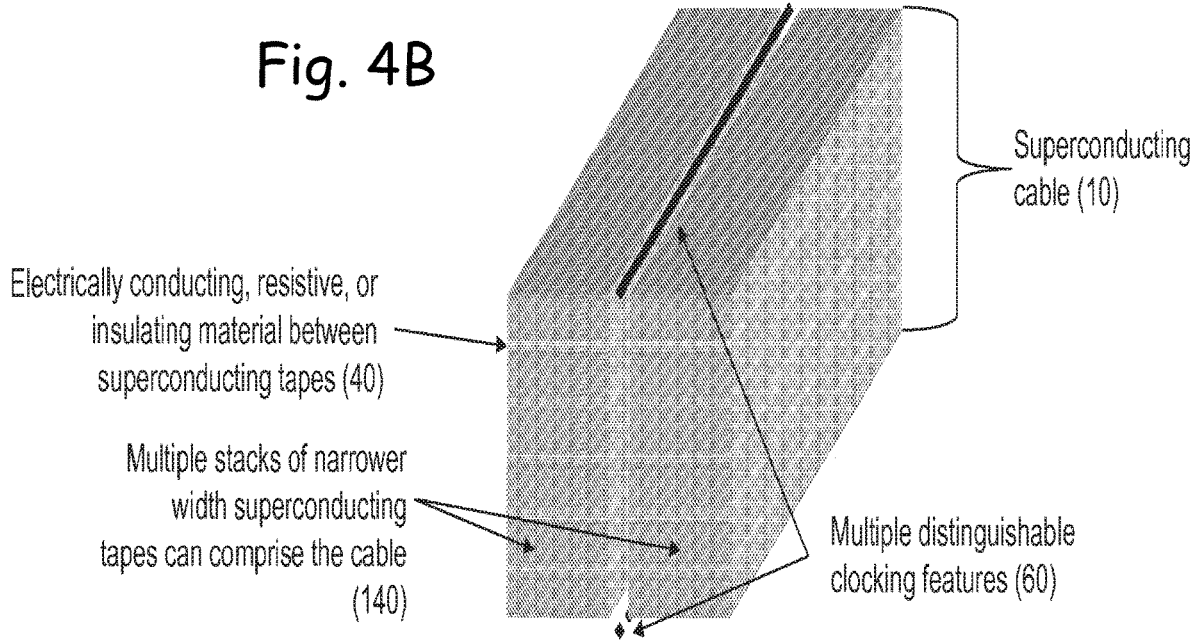

With reference to FIG. 4A, the superconducting cable (10) can be comprised of multiple stacks (140) of narrower diameter/width superconducting wires or tapes (20). The superconducting wires or tapes can be un-bonded (30) or bonded (70). With respect to FIG. 4B, the superconducting cable (10) comprised of multiple stacks (140) of superconducting wires or tapes (20) and non-superconducting material (40) such as Cu, Al, Ag, Au, brass, bronze, stainless steel, those materials currently sold under the brands Kapton™ Cryoflex™, etc.

With reference to FIG. 5, the superconducting cable (10) can be comprised of multiple stacks (140) of multiple superconducting wires or tapes (20) can be wrapped or co-extruded with electrically insulating materials (80) such as those currently sold under the brands Nomex™, Kapton™ (polyimide), PTFE, Cryoflex™, etc. A single clocking feature (50) or multiple clocking features (60) can be included for enhancements.

Figure 6A:
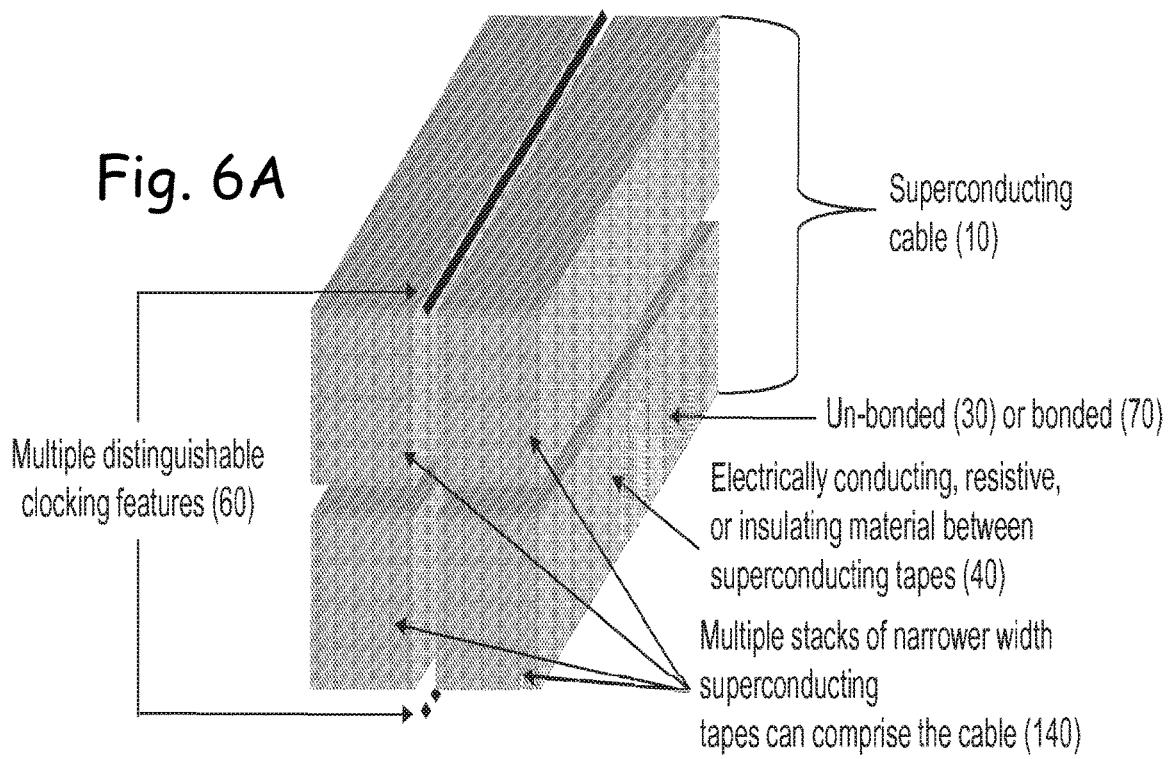
FIGS. 6A-6B show another "bird's-eye-view" of multiple stacks of superconducting tapes forming a superconducting cable covered with electrical insulation with multiple distinguishable clocking features.
Figure 6B:
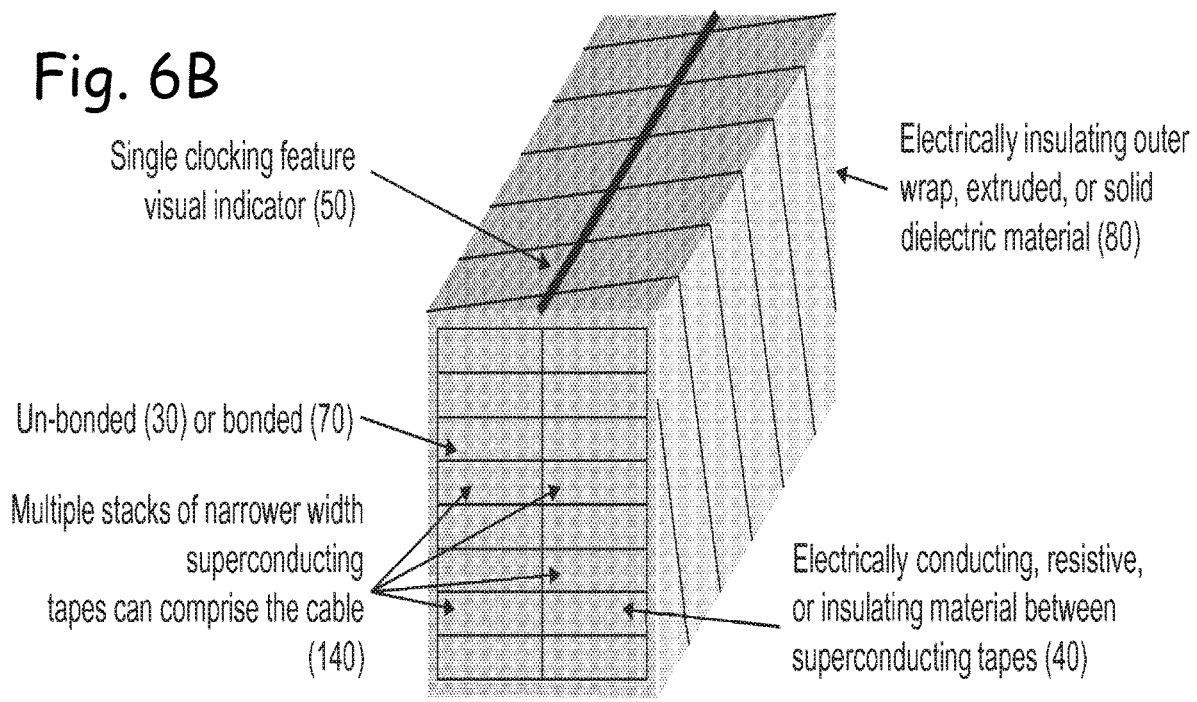

With reference to FIGS. 6A and 6B, the superconducting cable (10) can be comprised of smaller/narrower multiple stacks (140) of multiple superconducting wires or tapes (20) and can be wrapped or co-extruded with electrically insulating materials (80) such as those currently sold under the brands Nomex™, Kapton™ (polyimide), PTFE, Cryoflex™, etc. A single clocking feature (50) or multiple clocking features (60) can be included for enhancements. Electrically conducting, resistive, or insulating non-superconducting material (40) can be included in the stack of superconducting wires or tape (20) comprising the superconducting cable (10).

Figure 7A:
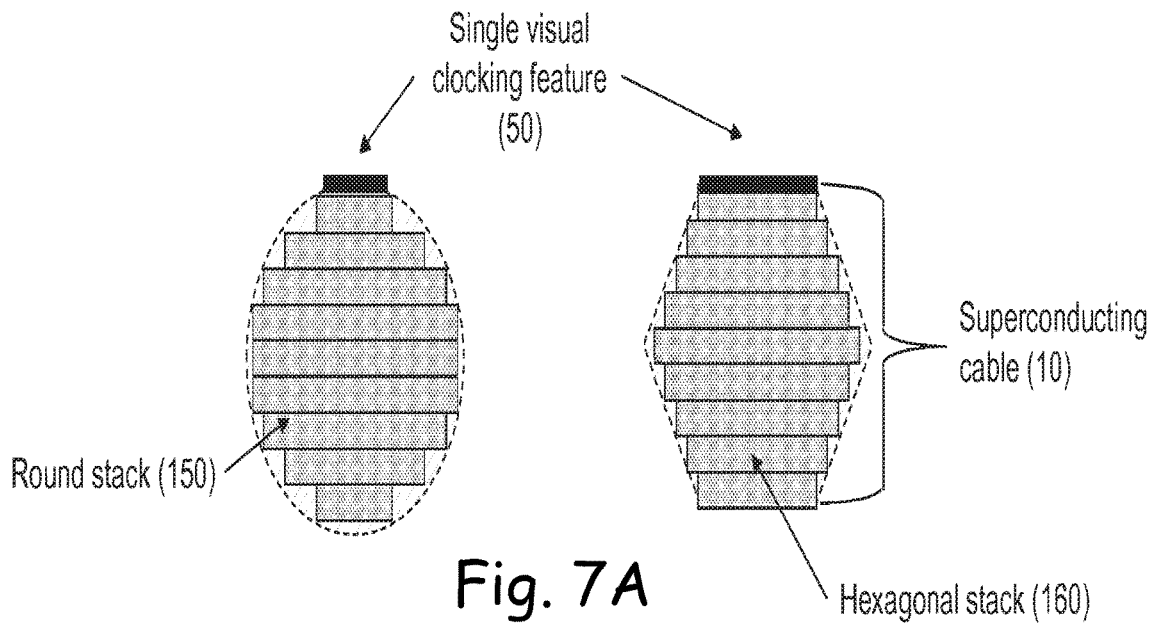
FIGS. 7A-7B show various cross sections of a superconducting cable.
Figure 7B:
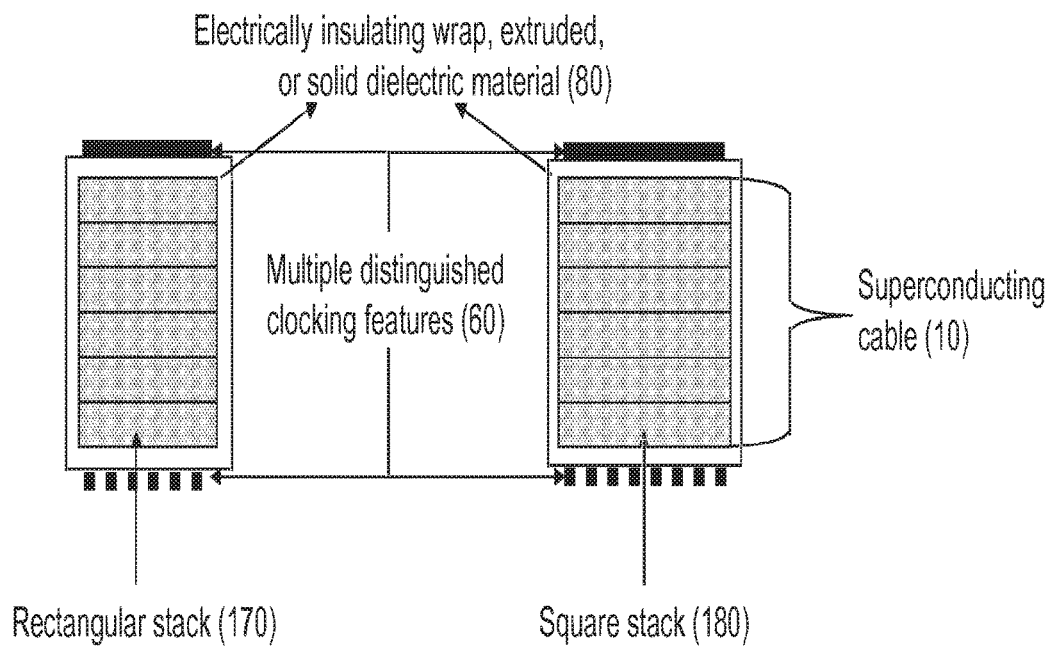

With reference to FIGS. 7A and 7B, the superconducting cable (10) can be comprised of multiple superconducting wires or tapes (20). The cross-section of the superconducting cable (10) can be round (150), hexagonal (160), rectangular (170), or square (180).

With respect to FIG. 8A, the superconducting cable (10) can include both horizontally stacked superconducting tapes (190) and vertically stacked (200) superconducting tapes. With respect to FIG. 8B, the superconducting cable (10) can be comprised of multiple stacks of superconducting tapes (140) that can include both vertically stacked superconducting tapes (200) and horizontally stacked (190) superconducting tapes.

Figure 9:
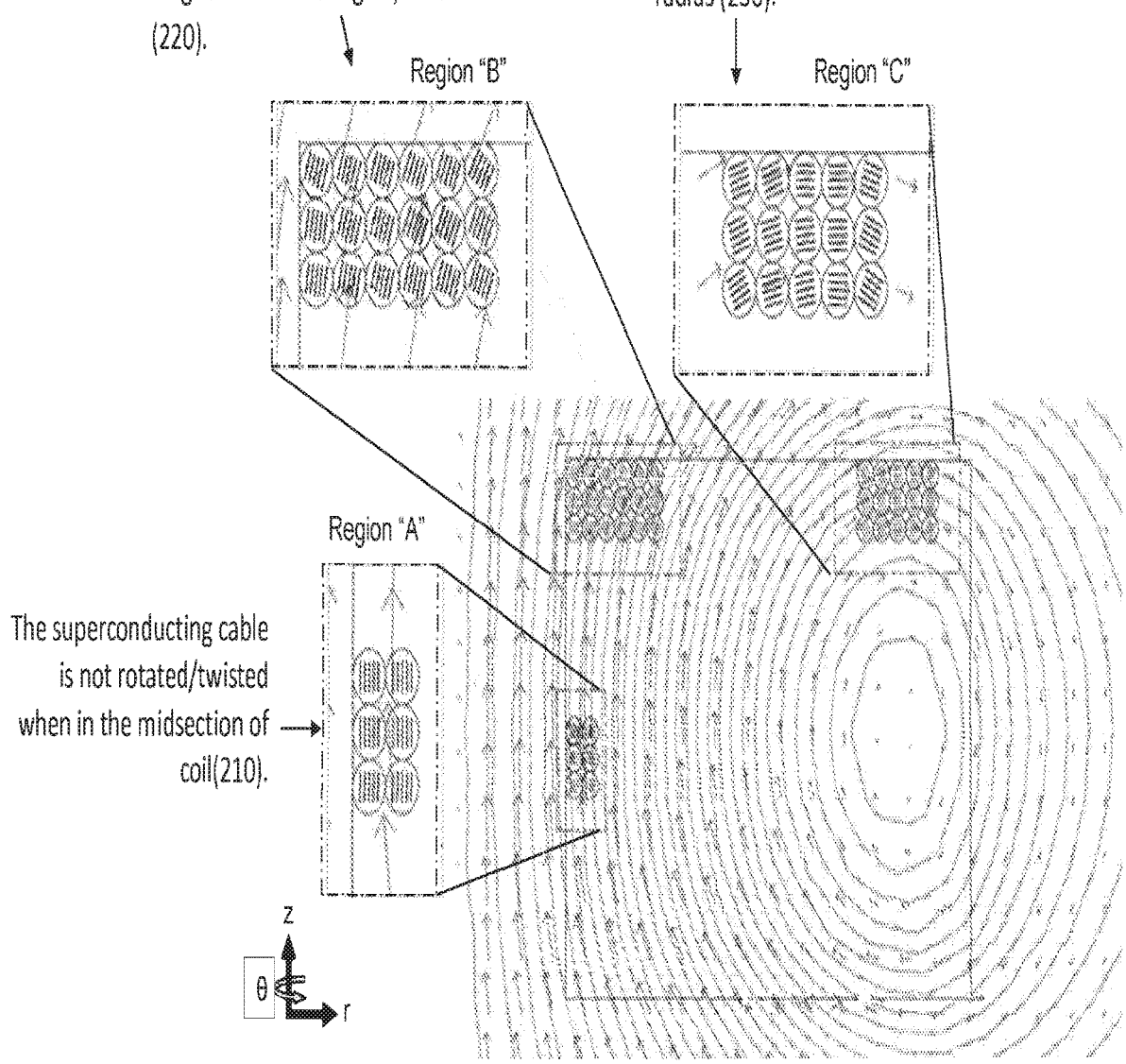
FIG. 9 shows three different regions/sections of a superconducting solenoid magnet with the respective angular orientations of the superconducting cables in that section relative to the background magnetic field.

With reference to FIG. 9, the superconducting cable (10) can be wound into a superconducting solenoid coil. For the solenoid coil, the superconducting cable is typically not rotated/twisted when in the central mid-plane region labeled "A" (210), where the neutral axis (90) of the superconducting cable (10) is aligned vertically and parallel with the longitudinal axis of the solenoid. In region A (210), the superconducting wires or tapes (20) are aligned vertically with the z-axis and thus are bent in the "easy" direction during winding fabrication.

As the superconducting cable (10) is wound along the longitudinal axis (z-axis) of the solenoid or toroid, the superconducting cable (10) is slightly rotated/twisted towards the ends of the magnet in region labeled "B" (220). Each turn/position within the winding pack has a designated clocking position that was pre-determined by an electro-magnetic calculation to carry the maximum current and have the minimal losses.

Towards the farthest ends of the solenoid or toroid, the superconducting cable (10) is rotated to its largest twist angle, with the single stack or multiple stacks of superconducting wires or tapes (20) now bent in-plane (i.e. hard direction) of the superconducting cable in region labeled "C" (230). The diameter of the solenoid or toroid should not exceed the minimum in-plane bend diameter of the superconducting cable (10).

Figure 10:
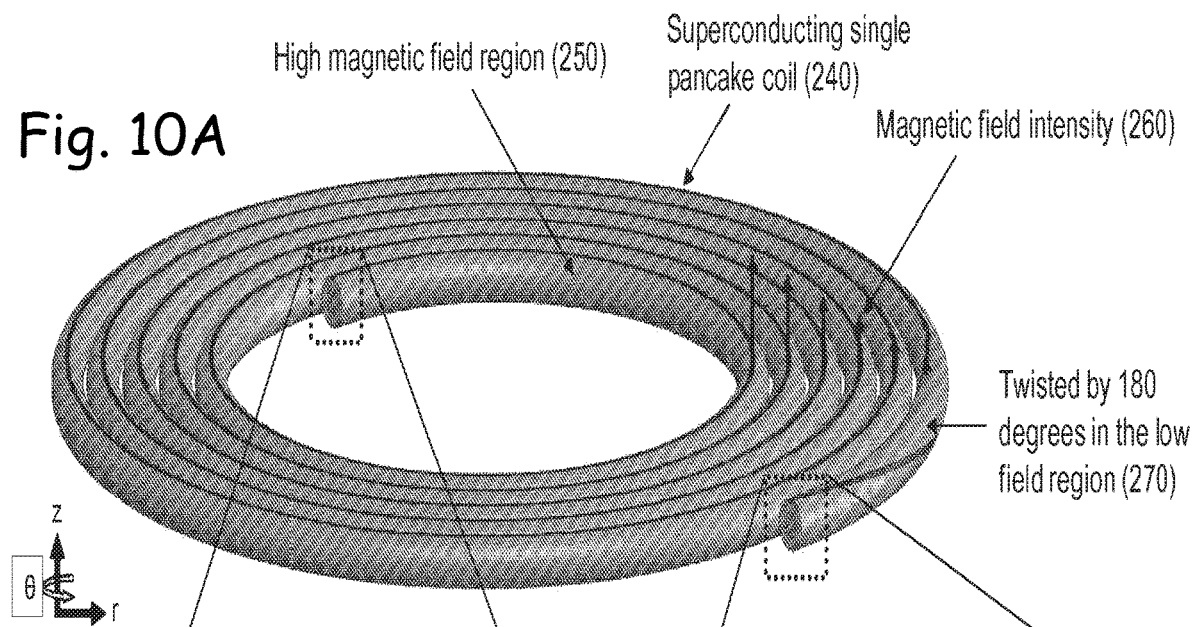
FIGS. 10A-10C show a "bird-eye-view" of a single pancake style coil winding with the superconducting cable or superconducting CICC rotated by 180 degrees in the outermost turn of the pancake coil.

With reference to FIG. 10A, a superconducting single pancake coil (240) can be wound with a superconducting cable (10) comprised of multiple superconducting wires or tapes (20). The inner diameter of the superconducting single pancake coil (240) has the highest magnetic field region (250). The magnetic field intensity (260) of the superconducting coil (240) is highest on the inner turns of the superconducting cable (10) and decreases towards the outer turns.

Figure 11:
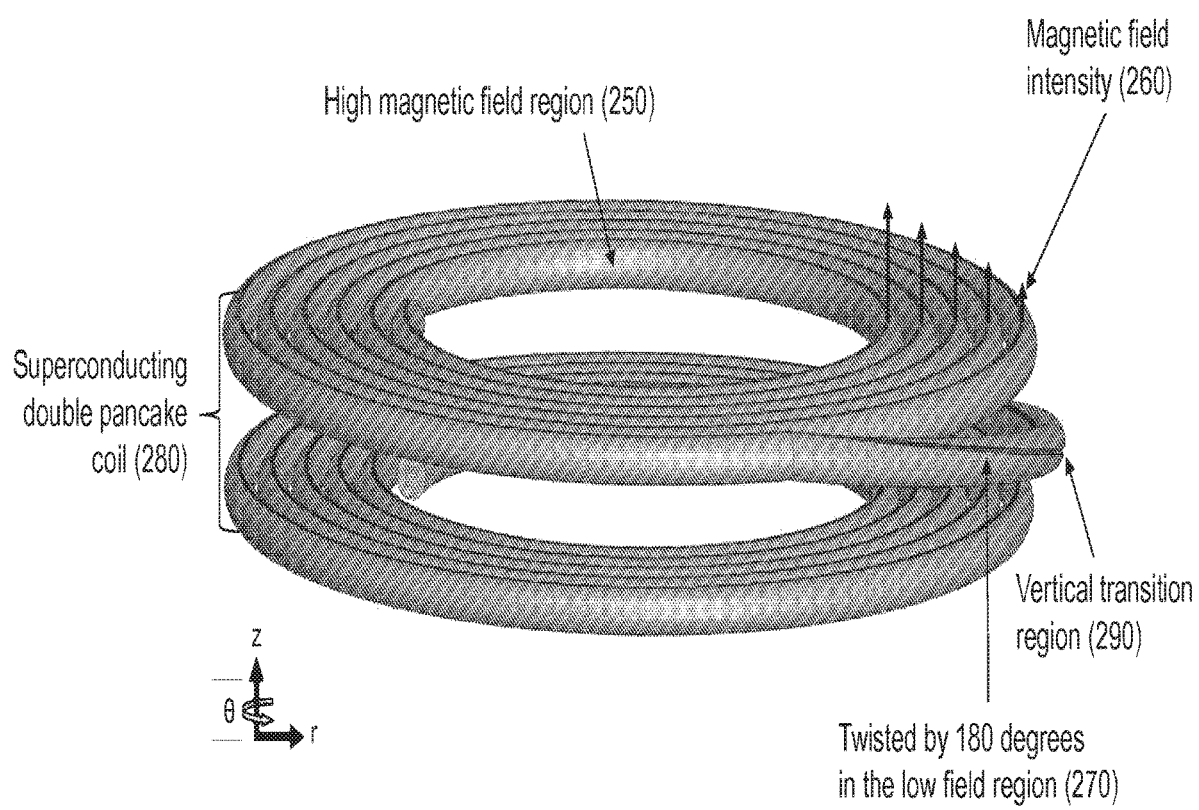
FIG. 11 shows a "birds-eye-view" of a double pancake style coil winding with the superconducting cable or the superconducting CICC rotated by 180 degrees in the outermost turn as the winding transitions from one pancake to the other.

The superconducting cable (10) can be rotated/twisted by 180 degrees in the outer turns (270) where the magnetic field intensity (260) is the lowest. With respect to FIGS. 10B and 10C, the zoomed in view of the superconducting cable (10) shows the inversion of the stack of superconducting wires or tapes (20). This enhancement has many benefits including: lower loss and helps to more evenly distribute the self-inductance which helps more evenly distribute the current flow among the superconducting tapes (20). Also note the rotated clocking feature (60) by 180 degrees With reference to FIG. 11, a superconducting double pancake coil (280) can be wound with a superconducting cable (10) comprised of multiple superconducting wires or tapes (20). The inner diameter of the superconducting double pancake coil (280) has the highest magnetic field region (250). The magnetic field intensity (260) of the superconducting double pancake coil (280) is highest on the inner turns of the superconducting cable (10) and decreases towards the outer turns. The superconducting cable (10) can be rotated/twisted by 180 degrees in the outer turns or the transition region (290) from one single pancake coil to the other, where the magnetic field intensity (260) is the lowest.

With reference to FIGS. 12A-12C, a superconducting cable (10) comprised of multiple superconducting wires or tapes (20) can be inserted into a non-superconducting conduit or sheath (300). The non-superconducting conduit or sheath (300) can be compacted or compressed around the superconducting cable (10) to form a superconducting CICC (310). The superconducting CICC (310) can have a single clocking feature that is a mechanical mechanism (320) or multiple distinguishable clocking features (330) that are different shaped mechanical mechanisms. The superconducting CICC (310) can also be comprised of multiple stacks of superconducting wires or tapes (140). The superconducting CICC can be wrapped or co-extruded with electrically insulating material (80) to a rated voltage and for environmental protection.

Figure 13A:
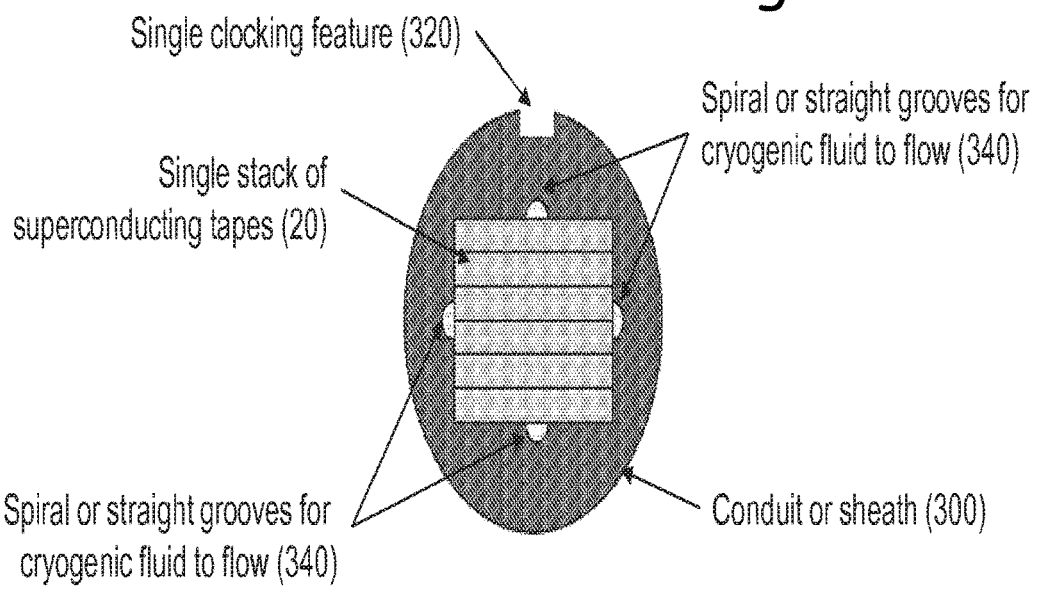
FIGS. 13A-13B show various cross sections of a superconducting CICC with multiple channels/grooves and/or spacers for coolant flow.
Figure 13B:
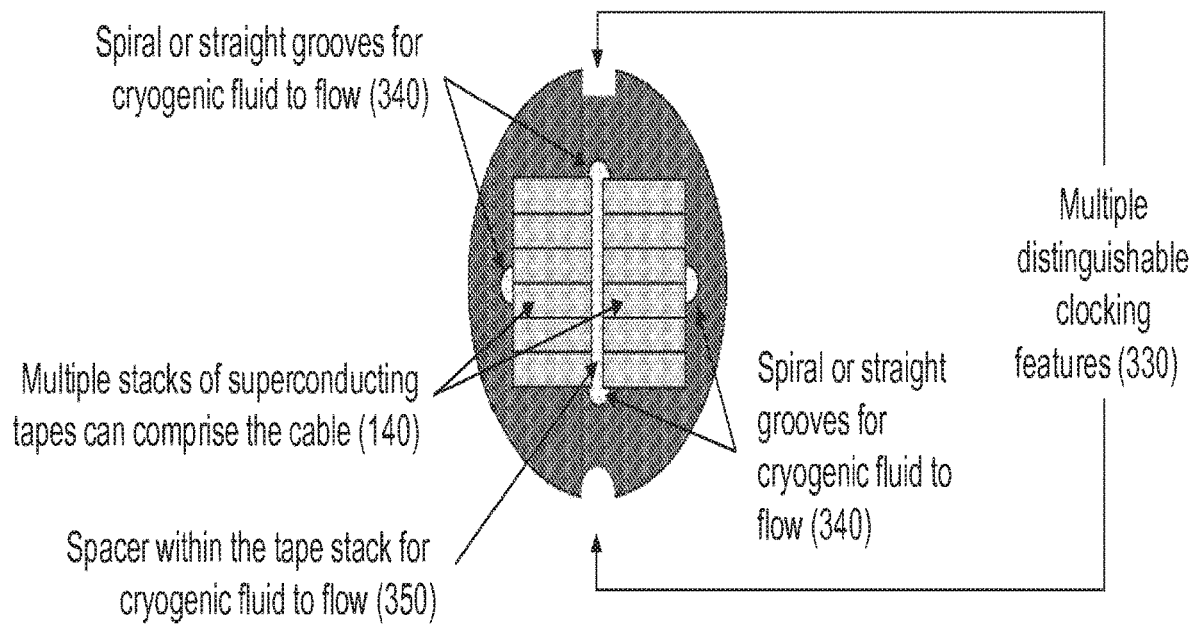

With reference to FIGS. 13A and 13B, a superconducting cable (10) comprised of a single stack of superconducting wires or tapes (20) or multiple stacks of superconducting wires or tapes (140) can be inserted into a non-superconducting conduit or sheath (300) that is subsequently compacted to form a superconducting CICC (310). The non-superconducting conduit or sheath (300) can have multiple grooves or channels (340) that are straight or spirally cut along its longitudinal length. The grooves or channels (340) allow cryogenic coolant to flow along the superconducting CICC (310) and allow it to operate at the proper temperature. A non-superconducting spacer (350) can be configured to operate with the superconducting cable (10) and allow coolant to flow along the superconducting cable (10).

Figure 14A:
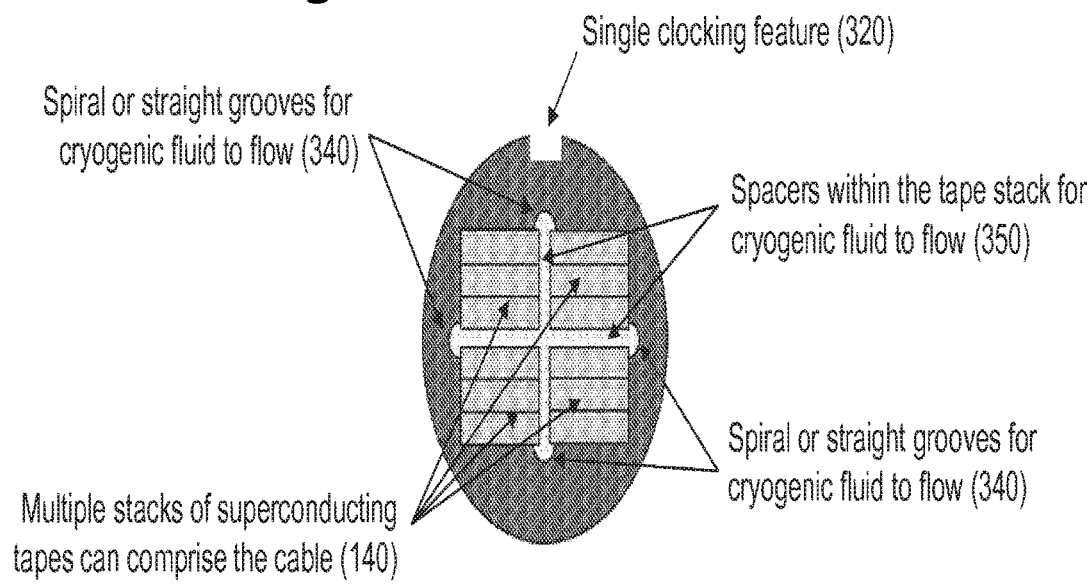
FIGS. 14A-14B show more cross sections of a superconducting CICC with multiple channels/grooves and/or spacers for coolant flow.
Figure 14B:
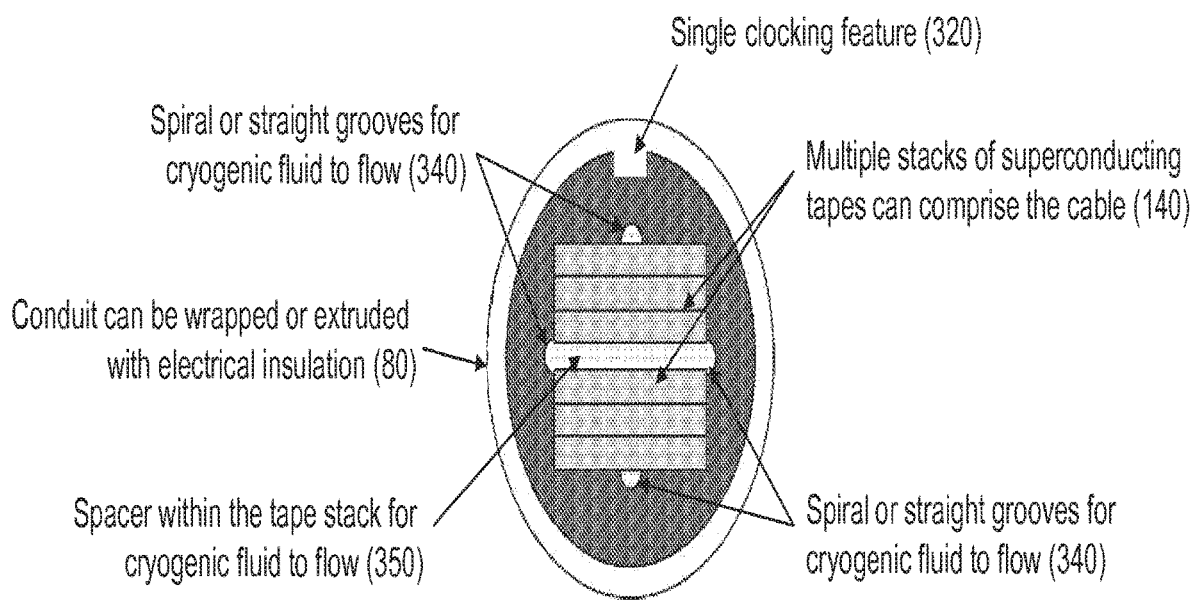

With reference to FIGS. 14A and 14B, there are many possible configurations, geometries, shapes, and sizes of the grooves or channels (340) and the non-superconducting spacers (350). It is important to perform fluid dynamic calculations to determine the size, shape, depth, and location of the grooves or channels (340) and non-superconducting spacers (350) for each application.

Figure 15A:
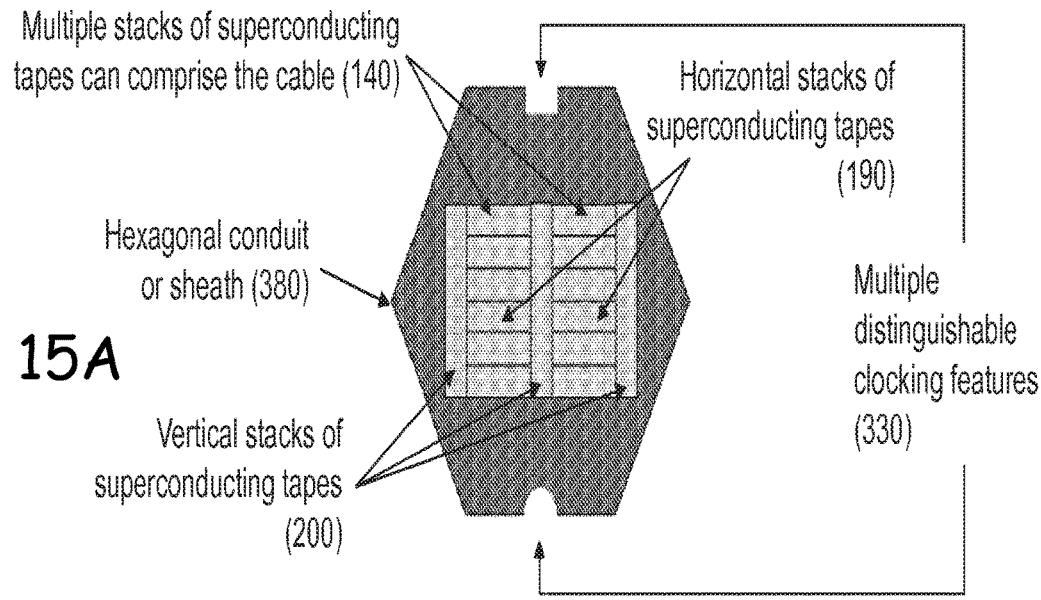
FIGS. 15A-15C show further cross sections of a superconducting CICC with multiple channels/grooves and/or spacers for coolant flow.
Figure 15B:
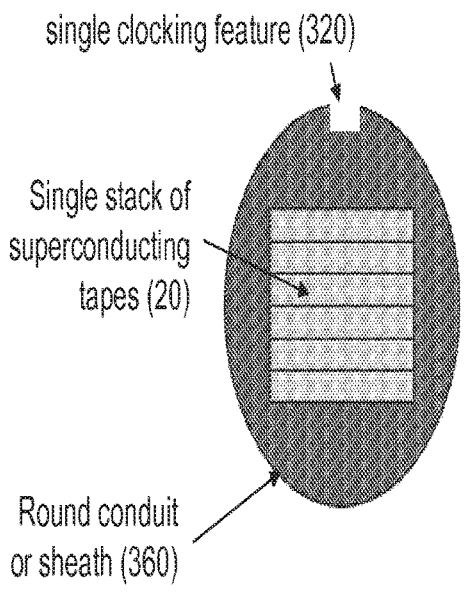
Figure 15C:
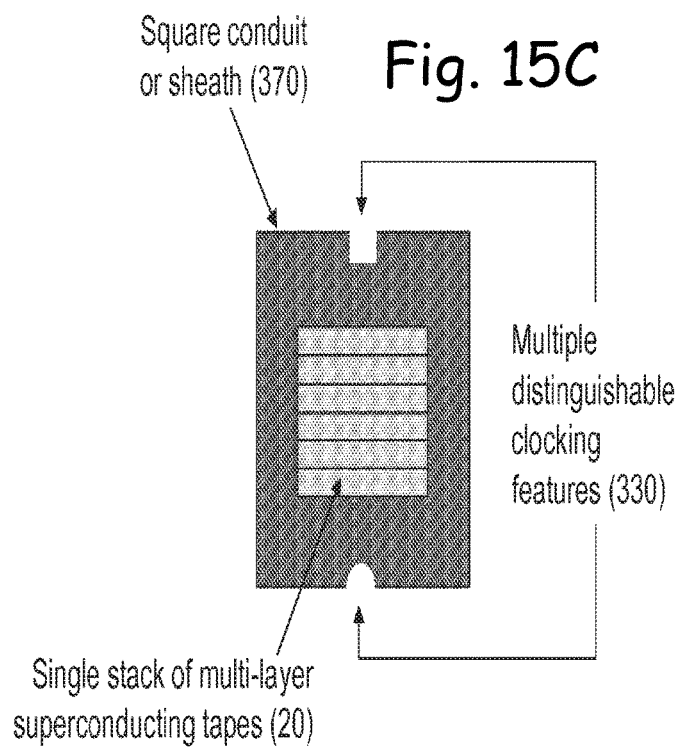

With respect to FIGS. 15A-15C, the superconducting CICC (310) can have many different shaped cross sections including round (310), square, 370, hexagonal (380), and well as other cross sections (not shown).

Figure 16:
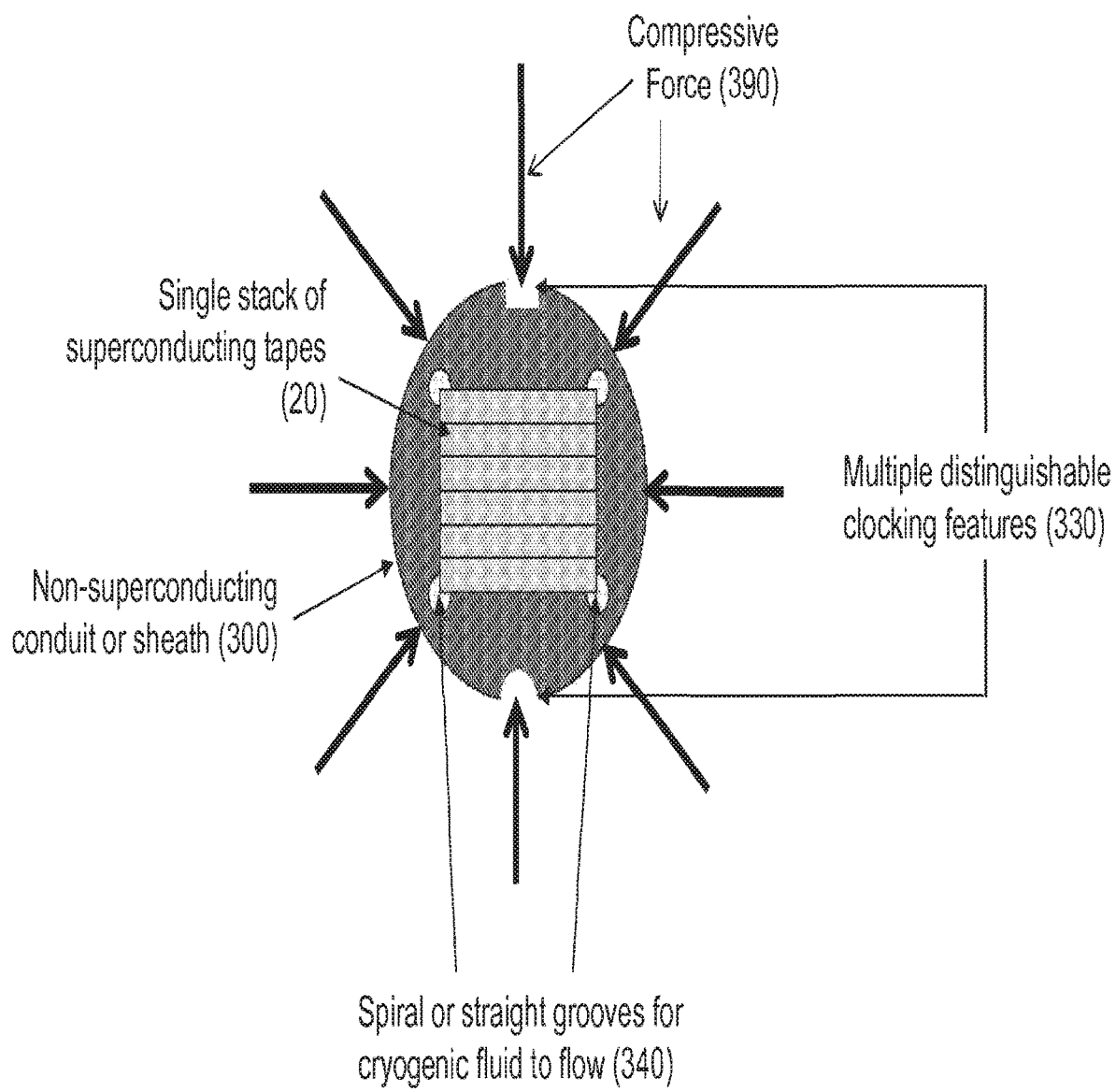
FIG. 16 shows a "birds-eye-view" of a round superconducting CICC with a superconducting cable with a rectangular cross section being uniformly compacted. Gaps/voids are strategically located at the corners of the superconducting cable where the stress concentrations are the highest.

With respect to FIG. 16, the superconducting cable (10) comprised of multiple superconducting wires or tapes (20) comprise the superconducting CICC (310). The superconducting CICC (310) can be formed by applying a uniform compaction force (390) to the non-superconducting conduit or sheath (300). Grooves or channels (340) can be placed at the corners of the superconducting cable (10) so that during compaction (390), the compressive stress is minimized in regions of high compressive stress. The size, shape, depth, and location of these grooves or channels (340) must be designed and optimized by both mechanical stress and fluid dynamic calculations.

Figure 17A:
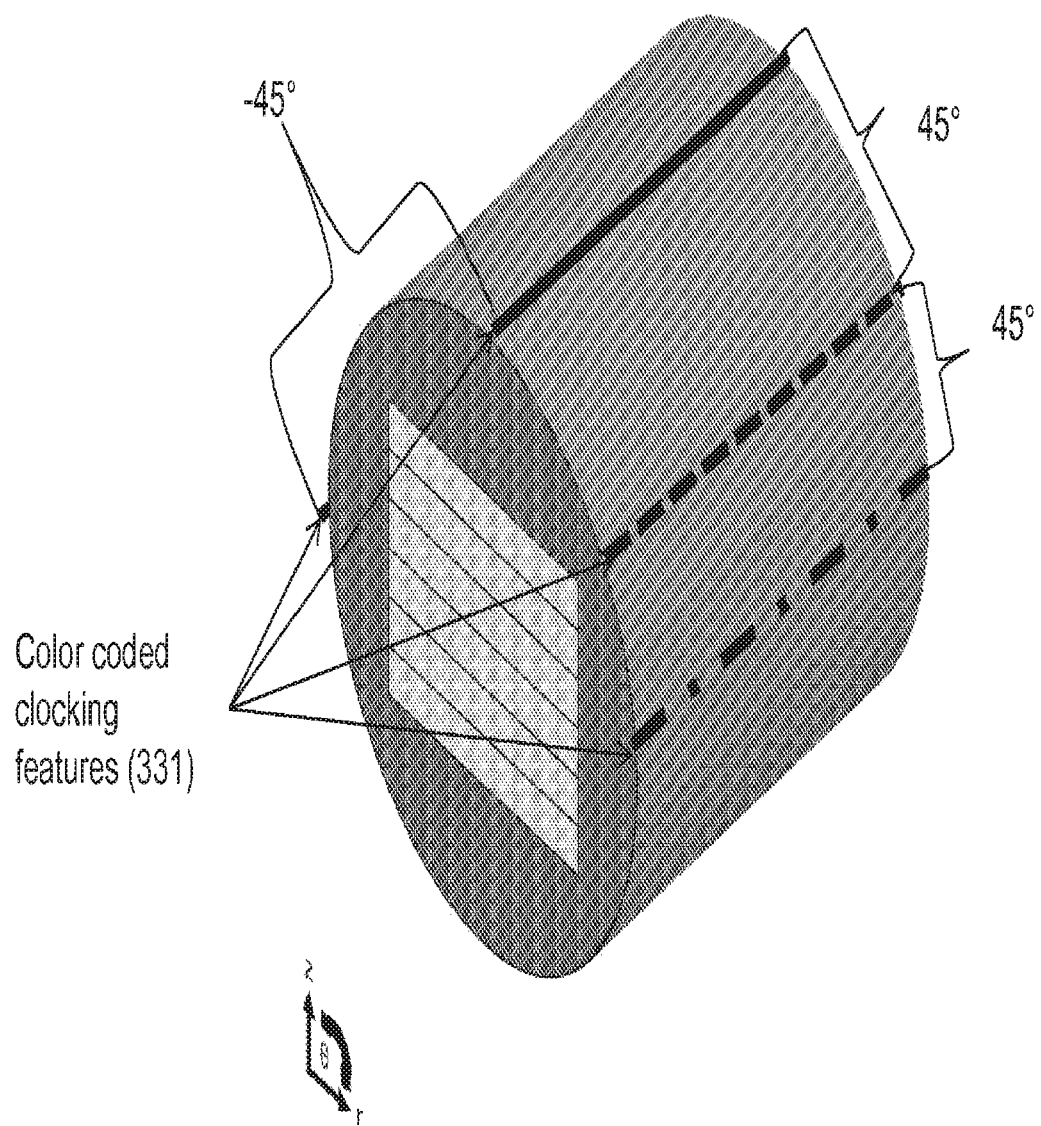
FIG. 17A shows an isometric view of a round superconducting CICC with different colored visual indicators as multiple distinguishable clocking features.

With respect to FIG. 17A, an isometric view of a round superconducting CICC with multiple visual indicators (331) as clocking features is shown. The clocking features are located at 45° increments, although other angular increments are possible.

Figure 17B:
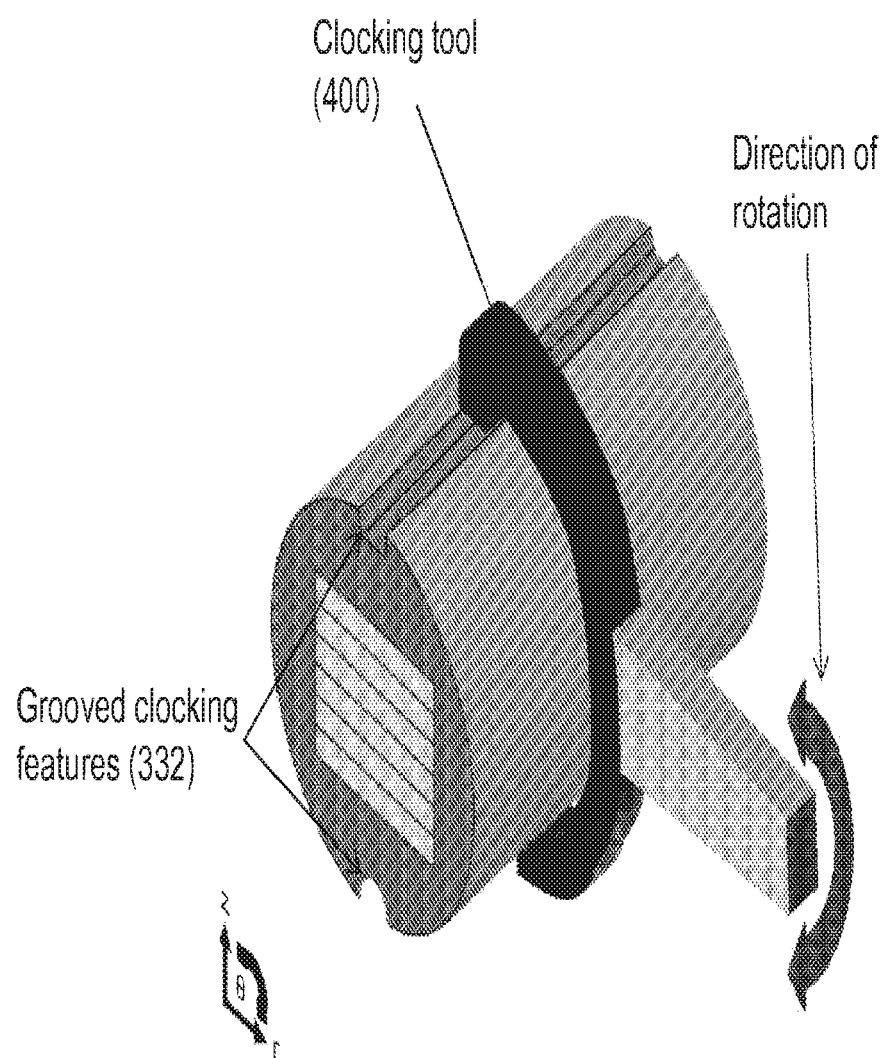
FIG. 17B shows an isometric view of a round superconducting CICC with different shaped mechanical grooves as multiple distinguishable clocking features.

With respect to FIG. 17B, an isometric view of a round superconducting CICC with multiple mechanical grooves (332) as clocking features is shown. The number, size, shape, depth, of the mechanical grooves can be optimized for the application. A clocking tool (400) can be used to twist/rotate the superconducting CICC to its approximately optimal angle. The superconducting CICC can be rotated other clockwise or counter-clockwise to maximize its current carrying capacity (Ic). Superconducting ReBCO tapes grown with the IBAD process tend not to be symmetric with clockwise/counterclockwise rotations, so it is best to select the optimal rotational direction.

Figure 17C:
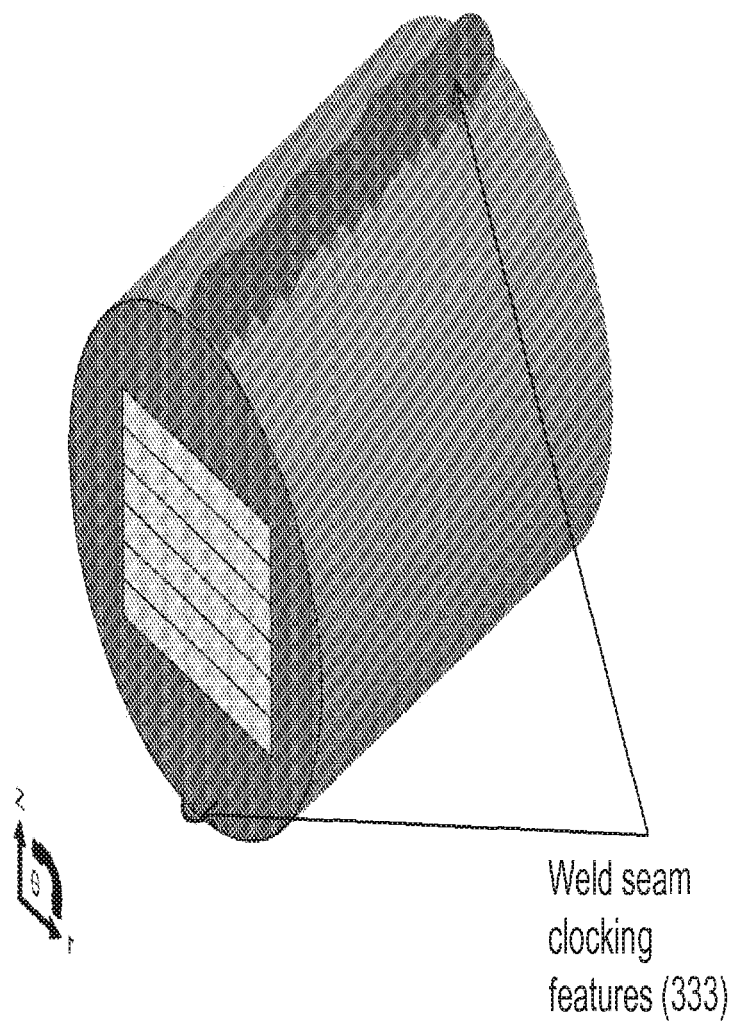
FIG. 17C shows an isometric view of a round superconducting CICC with multiple longitudinal seam welds as multiple distinguishable clocking features.

With respect to FIG. 17C, an isometric view of a round superconducting CICC with multiple longitudinal seam welds (333) as clocking features is shown. Besides acting as a visual indicator, if the conduit is stainless steel, the seam welds can be magnetic compared to the un-welded regions, and thus act as a measurable magnetic permeable quantity and thus be another way to identify angular rotation.

Figure 17D:
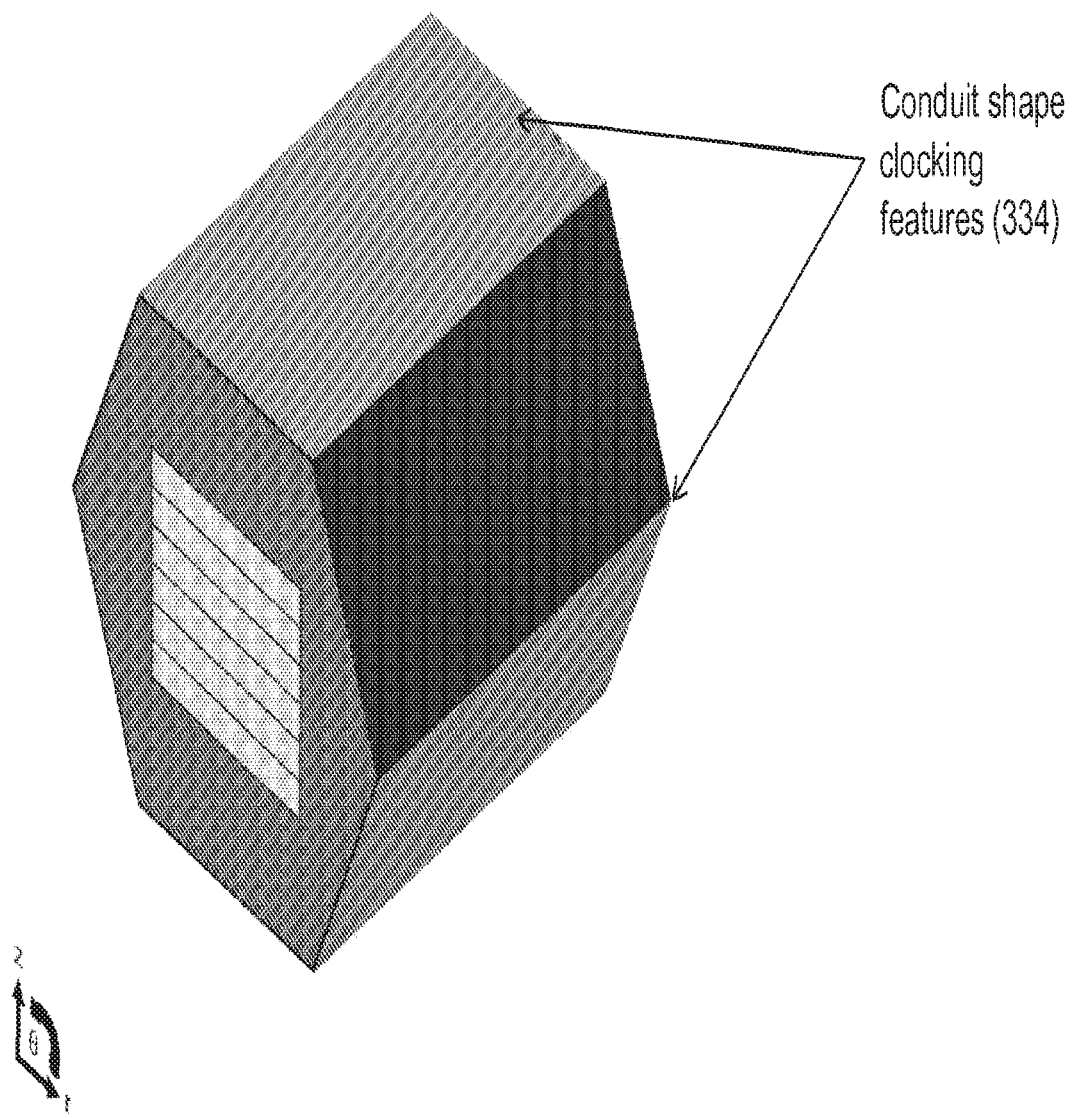
FIG. 17D shows an isometric view of a hexagonal superconducting CICC with multiple shaded sides as multiple distinguishable clocking features.

With respect to FIG. 17D, an isometric view of a hexagonal superconducting CICC with multiple shaded sides (334) as clocking features is shown.

Figure 18:
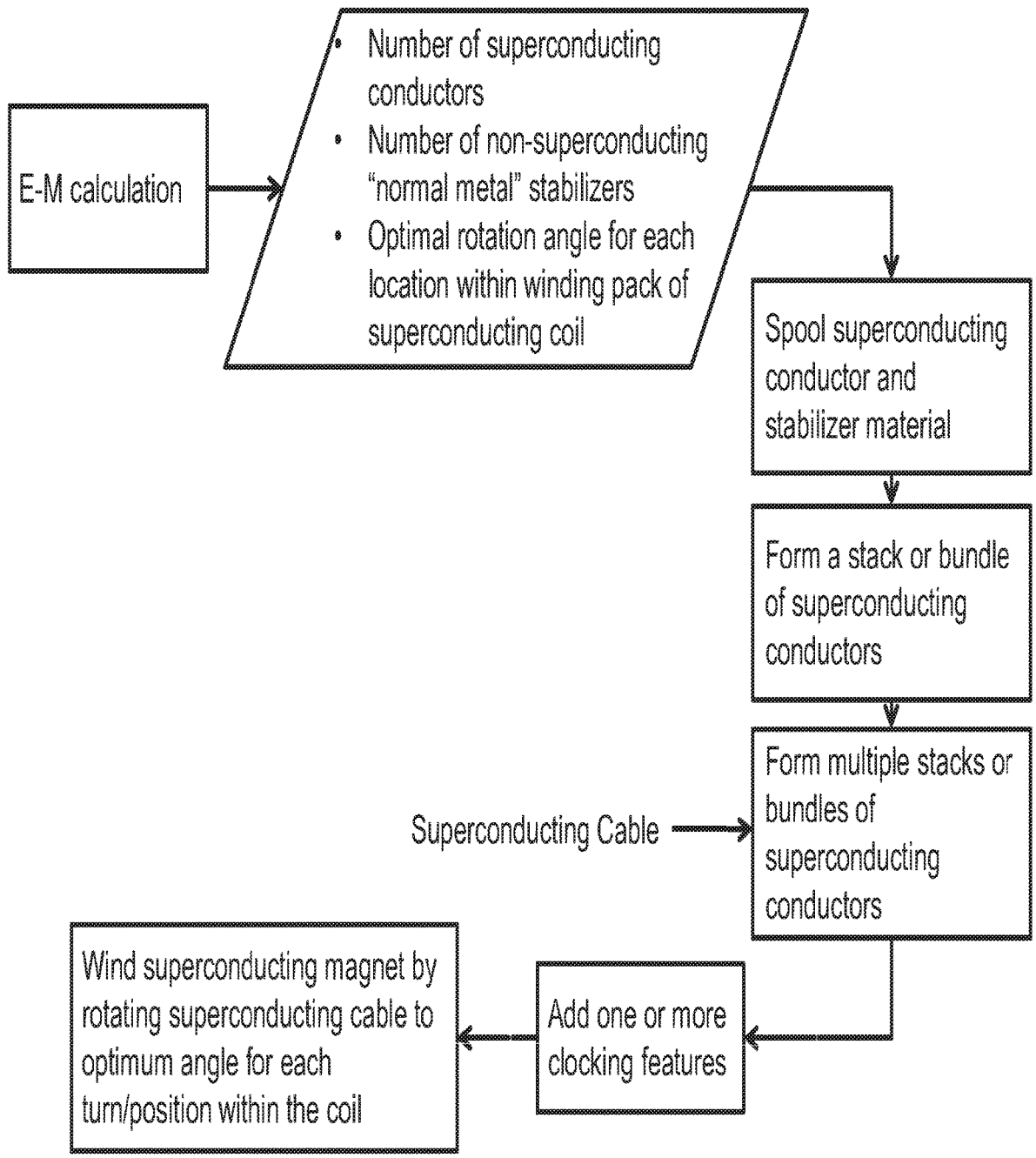
FIG. 18 shows a process flow diagram for an example method of fabrication for a superconducting cable.

With respect to FIG. 18, a high-level process flow diagram is shown for the fabrication of a superconducting cable with a clocking feature or features.

Figure 19:
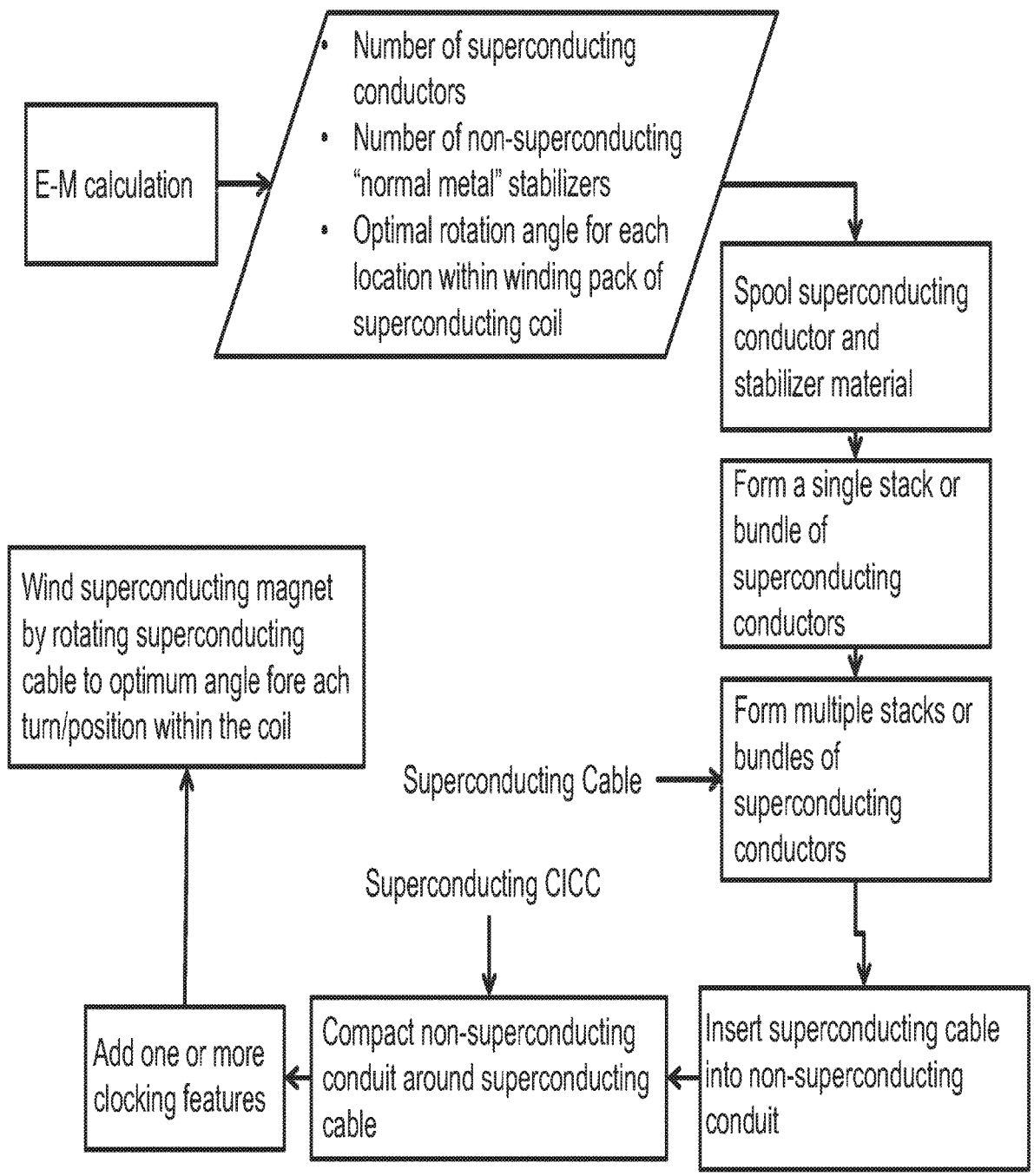
FIG. 19 shows a process flow diagram for an example method of fabrication for a superconducting CICC.

With respect to FIG. 19, a high-level process flow diagram is shown for the fabrication of a superconducting cable-in-conduit with a clocking feature or features.

It is recognized that modifications and variations of the invention will be apparent to those of skill in the art and it is intended that all such modifications and variations be included within the scope of the appended claims.

The invention claimed is:

1. A method of coiling a superconducting cable, the method comprising:
    providing the superconducting cable that is comprised of
        a plurality of stacked superconducting tapes, wherein the superconducting cable has at least one distinguishable clocking feature on a surface of the superconducting cable that identifies an orientation of the superconducting tapes,
    a step of orienting coils of the superconducting cable as the superconducting cable is coiled such that a magnetic field from surrounding coils of the superconducting coil impinge upon a given coil of the superconducting cable at a desired angle being circumferential or axial to the superconducting tapes based upon the orientation of the at least one clocking feature.

2. The method of claim 1, wherein the at least one clocking feature comprises a plurality of clocking features.

3. The method of claim 1, wherein the at least one clocking feature comprises a plurality of color-coded clocking features.

4. The method of claim 1, wherein the at least one clocking feature is visually perceptible.

5. The method of claim 1, wherein the at least one clocking feature comprises a stripe running along a length of the superconducting cable.

6. The method of claim 1, wherein the at least one clocking feature comprises a groove running along a length of the superconducting cable.

7. The method of claim 1, wherein the superconducting tapes each have a substantially rectangular cross-section with a wider face and a narrower face.

8. The method of claim 7, wherein the at least one clocking feature is oriented such that the magnetic field impinges upon the wider face of the superconducting tapes of the given coil.

9. The method of claim 1, wherein at least a portion of the superconducting tapes are bonded together with a non-superconducting material.

10. The method of claim 1, wherein a successive coil is twisted as it is laid on a preceding coil such that a magnetic field from the preceding coil impinges upon the successive coil at a desired angle based upon the orientation of the at least one clocking feature.

11. The method of claim 1, wherein at least a portion of the superconducting tapes are separated one from another with at least one of an electrically conducting material, an electrically resistive material, and an electrically insulating material.

12. The method of claim 1, wherein the superconducting cable has at least one of a round cross-section, a hexagonal cross-section, and a rectangular cross-section.

13. The method of claim 1, wherein all coils within a given layer of the coiled superconducting cable are laid with the at least one clocking feature in a common orientation, and all coils within an adjacent layer of the coiled superconducting cable are laid with the at least one clocking feature in an alternate orientation, where in the alternate orientation is 180 degrees from the common orientation.

14. A method of coiling a superconducting cable, the method comprising:
    providing the superconducting cable that is comprised of
        a plurality of stacked superconducting tapes each having a substantially rectangular cross-section with a wider face and a narrower face, wherein the superconducting cable has at least one visually-perceptible clocking feature running along a length of the superconducting cable that identifies an orientation of the superconducting tapes,
    a step of twisting the superconducting cable as the superconducting cable is coiled to form a successive coil that is laid on a preceding coil such that a magnetic field from the preceding coil impinges upon the successive coil at a desired angle being circumferential or axial to the superconducting tapes based upon the orientation of the at least one clocking feature.

15. The method of claim 14 wherein the at least one clocking feature comprises a plurality of clocking features.

16. The method of claim 14 wherein the at least one clocking feature comprises a groove running along a length of the superconducting cable.

17. The method of claim 14 wherein the at least one clocking feature is oriented such that the magnetic field impinges upon the wider face of the superconducting tapes of the successive coil.

18. The method of claim 14 wherein the successive coil is twisted as it is laid on the preceding coil, such that the magnetic field from the preceding coil impinges upon the successive coil at a desired angle, based upon the orientation of the at least one clocking feature.

19. The method of claim 14 wherein the superconducting cable has at least one of a round cross-section, a hexagonal cross-section, and a rectangular cross-section.

20. The method of claim 14 wherein all coils within a given layer of the coiled superconducting cable are laid with the at least one clocking feature in a common orientation, and all coils within an adjacent layer of the coiled superconducting cable are laid with the at least one clocking feature in an alternate orientation, wherein the alternate orientation is 180 degrees from the common orientation.

* * * * *

UNITED STATES PATENT AND TRADEMARK OFFICE
CERTIFICATE OF CORRECTION

| | | |
|---|---|---|
| PATENT NO. | : 11,978,571 B2 | Page 1 of 1 |
| APPLICATION NO. | : 16/948241 | |
| DATED | : May 7, 2024 | |
| INVENTOR(S) | : Christopher M. Rey | |

It is certified that error appears in the above-identified patent and that said Letters Patent is hereby corrected as shown below:

In the Specification

Before the PRIORITY in Column 1, Line 4, insert the following:
--GOVERNMENT RIGHTS
This invention was made with government support under ARPA contract DE-AR0000337 awarded by the United States Department of Energy. The government has certain rights in the invention.--

Signed and Sealed this
Eleventh Day of June, 2024

Katherine Kelly Vidal
*Director of the United States Patent and Trademark Office*